(12) United States Patent
Harada

(10) Patent No.: US 7,708,614 B2
(45) Date of Patent: May 4, 2010

(54) METHOD FOR SEALING ORGANIC ELECTROLUMINESCENCE ELEMENTS AND MANUFACTURING METHOD FOR LIGHT EMITTING PANEL AND DISPLAY PANEL

(75) Inventor: Gaku Harada, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 1011 days.

(21) Appl. No.: 11/301,116

(22) Filed: Dec. 13, 2005

(65) Prior Publication Data

US 2006/0135029 A1    Jun. 22, 2006

(30) Foreign Application Priority Data

| Dec. 13, 2004 | (JP) | ............................. 2004-360638 |
| Mar. 29, 2005 | (JP) | ............................. 2005-096478 |
| Mar. 31, 2005 | (JP) | ............................. 2005-105133 |

(51) Int. Cl.
*H01J 9/00* (2006.01)
*H01J 9/24* (2006.01)
*H01J 17/49* (2006.01)

(52) U.S. Cl. ............................. 445/25; 445/24; 385/88; 313/512

(58) Field of Classification Search ....................... None
See application file for complete search history.

(56) References Cited

U.S. PATENT DOCUMENTS

| 6,896,572 | B2 * | 5/2005 | Park et al. ...................... 445/25 |
| 2003/0017777 | A1 * | 1/2003 | Matsuoka et al. ............. 445/24 |
| 2005/0025435 | A1 * | 2/2005 | Miyamae ..................... 385/88 |
| 2005/0151475 | A1 * | 7/2005 | Sasaki et al. ................. 313/582 |
| 2005/0191928 | A1 * | 9/2005 | Jang ............................ 445/25 |

FOREIGN PATENT DOCUMENTS

| JP | 2000-010506 | | 1/2000 |
| JP | 2001-126866 | | 5/2001 |
| WO | WO 0016364 | * | 3/2000 |

* cited by examiner

*Primary Examiner*—Sikha Roy
*Assistant Examiner*—Tracie Green
(74) *Attorney, Agent, or Firm*—McDermott Will & Emery LLP

(57) ABSTRACT

An adhesive is applied in a shape having a straight line portion and protruding portions protruding in the direction crossing the straight line portion to the surface of one of a first substrate where organic electroluminescence elements have been formed and a second substrate for sealing the organic electroluminescence elements, and the first and second substrates are pressed together in such a manner that the first and second substrates face and approach each other, and thereby, the adhesive is spread between the first and second substrates so that the organic electroluminescence elements are sealed.

4 Claims, 16 Drawing Sheets

(a)

(b)

(a)

(b)

(a)

(b)

(c)

(a)

(b)

(c)

(d)

(a)

(b)

(c)

(d)

METHOD FOR SEALING ORGANIC ELECTROLUMINESCENCE ELEMENTS AND MANUFACTURING METHOD FOR LIGHT EMITTING PANEL AND DISPLAY PANEL

BACKGROUND OF THE INVENTION

1. Field of the Invention

The present invention relates to a method for sealing electroluminescence elements capable of manufacturing electroluminescence elements having excellent display quality.

The present invention relates to a method for manufacturing a plurality of light emitting panels having a light emitting portion by forming a layered body where a plurality of light emitting portions are sealed between a mother substrate and a mother sealing plate, and after that, dividing the layered body into pieces, each of which has a light emitting portion, as well as to a method for manufacturing a plurality of light emitting panels having a display portion by forming a layered body where a plurality of display portions are sealed between a mother substrate and a mother sealing plate, and after that, dividing the layered body into pieces, each of which has a display portion.

2. Description of Related Art

In recent years, attention has been paid to organic electroluminescence (hereinafter referred to as organic EL) elements as self-luminous type light emitting elements, and the development of organic EL displays using such organic EL elements has been progressing. Organic EL elements are characterized by having quick response speed that is appropriate for animation display, low voltage and drive with low consumed power, and therefore, organic EL displays are expected to be next generation displays for next generation cellular phones, portable terminals (PDA's) and the like.

Organic EL displays are provided with an organic EL panel having a plurality of organic EL elements for displaying images, a drive circuit, a drive power supply and the like.

The light emitting properties of organic EL elements deteriorate when making contact with moisture, and therefore, it is necessary to seal organic EL elements so that the organic EL elements do not make contact with moisture in an organic EL panel. Therefore, organic EL panels are manufactured by pasting together an organic EL substrate where organic EL elements have been formed, and a sealing substrate for sealing using an adhesive for sealing.

As a conventional method for sealing EL elements, a method in which an EL substrate and a sealing substrate are sealed with a hardening resin in liquid form that has been dropped onto one of the substrates so as to form protrusions on the substrate is known (Japanese Unexamined Patent Publication 2000-10506). In accordance with this prior art, however, as shown in the plan diagram of FIGS. 2(a) and 2(b), a hardening resin in liquid form 42 spreads into circular shapes on an EL substrate 41 (FIG. 2(a)), and at the time of pasting, this hardening resin in liquid form 42 further spreads into concentric circular shapes, creating spaces 43 surrounded by resin 42, and bubbles are created, due to these spaces (FIG. 2(b)).

When bubbles are created in the adhesive layer between the organic EL substrate and the sealing substrate, the index of refraction in the bubble portions is different from the index of refraction of the surrounding adhesive layer, and therefore, the color of the bubble portions is seen as a different color from that of the surroundings. Thus, a problem arises, such that the shapes of the bubbles can be seen with the human eye when the organic EL display is displayed, and thus, the display quality is lowered. Furthermore, moisture that is included in the bubbles seeps into the organic EL elements so as to cause the light emitting properties to deteriorate, and therefore, the reliability of the organic EL elements is lowered. Accordingly, in order to provide an organic EL display having excellent display quality and high reliability, it is necessary to seal the organic EL elements without creating bubbles between the organic EL substrate and the sealing substrate.

Therefore, a method for sealing organic EL elements without creating closed spaces such as the above described spaces 43 by dropping a hardening resin 42 in liquid form onto one substrate along lines so as to prevent the above described spaces from being created in the resin 42 is described in Japanese Unexamined Patent Publication 2000-10506.

Meanwhile, a manufacturing method that is referred to as multiple panel taking is frequently adopted in the process for manufacturing organic EL display panels, in order to increase production efficiency (for example, Japanese Unexamined Patent Publication 2001-126866). Multiple panel taking is a method for manufacturing a plurality of organic EL display panels by pasting one mother substrate of which the size is sufficiently greater than that of one organic EL display panel and where a plurality of organic EL display portions are provided, and one mother sealing plate of which the size is sufficiently greater than that of one organic EL display panel together, and after that, dividing the resulting layered body into pieces, each of which has an organic EL display portion.

When the dropping method that is described in Japanese Unexamined Patent Publication 2000-10506 is adopted in multiple panel taking, it is necessary to drop a hardening resin in liquid form 42 for each of the number of organic EL display portions on the above described mother substrate, and therefore, the hardening resin in liquid form 42, 42 . . . spreads and is integrated, as shown in FIG. 2, in such a manner that air is left in closed spaces that are surrounded by the hardening resin 42 in liquid form. In the case where such closed spaces are created, air in the closed spaces cannot escape, even when pressure is applied to spread the hardening resin in liquid form 42, and these closed spaces restrict the distance between the mother substrate and the mother sealing plate, and therefore, the hardening resin in liquid form 42 cannot be uniformly spread in the organic EL display portions, and the distance between the two plates cannot be narrowed. Further, even if the closed spaces are compressed so as to uniform the distance between the mother substrate and the mother sealing plate, the area occupied by the closed spaces increase due to the constant volume of the closed spaces. Due to the existence of such closed spaces, as described above, a problem arises, such that the display quality of the organic EL display panels is lowered. In addition, the portions where the above described closed spaces exist in the organic EL display portions are not covered with the hardening resin in liquid form 42, and in the case where the plate is divided into respective organic EL display portions, a problem arises, such that the above described portions are exposed to the open air, and moisture in the open air seeps into the organic EL elements, making the light emitting properties deteriorate, and thus, the reliability of the organic EL elements is lowered.

In addition, when closed spaces are created, as described above, the distance between the mother substrate and the mother sealing plate cannot be reduced so as to be smaller than the height of these closed spaces, and therefore, the distance between the mother substrate and the mother sealing plate becomes greater than a predetermined distance. In the manufacture of light emitting panels or display panels, in some cases, the color chromaticity of light that is emitted is adjusted by setting the distance between the mother substrate and the mother sealing plate to a predetermined distance, and in such a case, when closed spaces as those described above are created in such a manner as to prevent the distance between the mother substrate and the mother sealing plate from being reduced to the height of these closed spaces or smaller, and therefore, the distance between the mother substrate and the mother sealing plate cannot be set to the predetermined distance, and a problem arises, where the color chromaticity of light that is emitted becomes different from that desired, and thus, the display quality is lowered.

A problem arises, such that the manufacture yield is lowered due to the reduction in the display quality and in the reliability, as described above.

As described above, in the case where the manufacturing method for an organic EL display panel that is described in Japanese Unexamined Patent Publication 2000-10506 is applied to multiple panel taking, a problem arises, such that the display quality of organic EL display panels becomes low and the yield also becomes low.

SUMMARY OF THE INVENTION

A first object of the present invention is to provide a method for sealing organic EL elements where the occurrence of bubbles can be prevented, and thereby, to provide an organic EL display having excellent display quality and higher reliability.

A second object of the present invention is to provide a manufacturing method for an organic EL display panel where an organic EL display panel having high display quality can be manufactured, reduction in the light emitting properties and reliability of the organic EL elements can be restricted, and reduction in the yield can be prevented.

<First Aspect of the Present Invention>

The first aspect of the present invention provides a method for sealing organic electroluminescence elements, characterized by having: the step of applying an adhesive in a shape having a straight line portion and protruding portions which protrude in the direction crossing the straight line portion on a surface of one of a first substrate where organic electroluminescence elements are formed and a second substrate for sealing the above described organic electroluminescence elements; and the step of sealing the above described organic electroluminescence elements by pressing the above described first and second substrates which face each other so that the above described first and second substrates approach each other, and thereby, spreading the above described adhesive between the above described first and second substrates.

In accordance with a method for sealing organic electroluminescence elements of the present invention, an adhesive is applied in a shape having a straight line portion and protruding portions which protrude in the direction crossing the straight line portion, and thereby, the adhesive can be spread so as to push out the spaces in the four corners with the protruding portions serving as guides, and therefore, the occurrence of bubbles can be prevented. Accordingly, when the organic electroluminescence elements are sealed, the occurrence of bubbles due to the spaces can be prevented, and thus, an organic electroluminescence display having excellent display quality can be provided.

According to the present invention, the above described step of applying an adhesive preferably includes the step of applying an adhesive in straight line form on the surface of one of the above described first and second substrates, and the step of applying an adhesive in the direction crossing the direction in which the adhesive in straight line form is applied.

By using such a sealing method, the portion where the above described adhesive crosses forms a protrusion in the cross section, and this portion having the form of a protrusion makes first contact with the substrate, and the surrounding surface of the adhesive sequentially makes contact with the substrate, and therefore, the occurrence of bubbles due to undulation of the surface of the adhesive can be prevented, and thus, an organic electroluminescence display having excellent display quality can be provided.

<Second Aspect of the Present Invention>

The second aspect of the present invention provides a method for sealing organic electroluminescence elements, characterized by having: the step of applying a first adhesive in locations corresponding to locations between organic electroluminescence elements and terminal portions on a surface of one of a first substrate where organic electroluminescence elements and terminal portions are formed and a second substrate for sealing the above described organic electroluminescence elements; the step of applying a second adhesive of which the viscosity is lower than that of the above described first adhesive in a shape having a straight line portion and protruding portions protruding in the direction crossing the straight line portion in locations that correspond to the above described organic electroluminescence elements; and the step of sealing the above described organic electroluminescence elements by pressing the above described first and second substrates against each other, and thereby, spreading the above described first and second adhesives between the above described first and second substrates.

By using such a sealing method, the first adhesive that has been applied to the locations that correspond to the locations between the above described organic electroluminescence elements and the above described terminal portions can prevent the above described second adhesive from making contact with the terminal portions that have been provided in the proximity of the organic electroluminescence elements. That is to say, in the step of pressing the above described first and second substrates against each other, and thereby, spreading the above described first and second adhesives between the above described first and second substrates, the first adhesive does not make contact with the terminal portions, because the first adhesive has a viscosity that is higher than that of the second adhesive and spreads less.

In addition, the second adhesive has a viscosity that is lower than that of the first adhesive and easily spreads, and the first adhesive has a viscosity that is higher than that of the second adhesive, and therefore, the second adhesive can be prevented from spreading over the first adhesive and making contact with the terminal portions, and instead, the second adhesive can be spread along the above described first adhesive.

Furthermore, the second adhesive is applied in a shape having a straight line portion and protruding portions which protrude in the direction crossing the straight line portion, and thereby, the adhesive can be spread so as to push out the spaces in the four corners with the protruding portions serving as guides, and therefore, the occurrence of bubbles can be prevented. When the organic electroluminescence elements are sealed, the occurrence of bubbles due to the spaces can be prevented, and thus, an organic electroluminescence display having excellent display quality can be provided.

According to the second aspect of the present invention, the step of applying a second adhesive preferably includes the step of applying a second adhesive of which the viscosity is lower than that of the above described first adhesive in straight line form in locations that correspond to the above described organic electroluminescence elements, and the step of applying the second adhesive in the direction crossing the direction in which the second adhesive is applied in straight line form.

By using such a sealing method, the portion where the above described second adhesive crosses forms a protrusion in the cross section, and this protrusion makes first contact with the substrate, and the surrounding surface of the adhesive sequentially makes contact with the substrate, and therefore, the occurrence of bubbles due to undulation of the surface of the adhesive can be prevented.

According to the second aspect of the present invention, the ratio of the viscosity of the above described first adhesive to the viscosity of the above described second adhesive is preferably not less than 24.

By using the first and second adhesives in such a manner, in the step of pressing the above described first and second substrates against each other, and thereby, spreading the above described first and second adhesives between the above described first and second substrates, the second adhesive can be spread along the above described first adhesive without failure, and thus, the occurrence of bubbles can be prevented. Furthermore, the second adhesive can be prevented from spreading over the first adhesive and making contact with the terminal portions, and in addition, the first adhesive changes in shape, spreading toward the terminal portion sides by being pushed by the second adhesive when the second adhesive spreads between the above described first and second substrates, and thereby, the first adhesive can be prevented from adhering to the terminal portions.

According to the present invention, the step of sealing the above described organic electroluminescence elements by pressing the above described first and second substrates against each other may be carried out under atmospheric pressure. In this case also, in accordance with the sealing method of the present invention, the adhesive can be spread so as to push the spaces out to the four corners, and therefore, the occurrence of bubbles can be prevented. Accordingly, the occurrence of bubbles due to the spaces can be prevented at the time of sealing of the organic electroluminescence elements, and thus, an organic electroluminescence display having excellent display quality can be provided.

The second aspect of the present invention provides an electroluminescence panel that has been manufactured in accordance with any of the above described methods.

In accordance with the first and second aspects of the present invention, organic EL elements can be filled in with and sealed by a hardening resin in liquid form without bubbles occurring between the organic EL substrate and the sealing substrate, and thereby, a technology capable of manufacturing organic EL displays having excellent display quality can be provided.

<Third Aspect of the Present Invention>

The third aspect of the present invention provides a method for manufacturing a light emitting panel, wherein a plurality of light emitting portions are formed on a mother substrate, a layered body where a mother sealing plate is made to adhere to the mother substrate via an adhesive layer so as to cover the number of light emitting portions is fabricated, and the layered body is separated into pieces, each of which has a light emitting portion, and thus a plurality of light emitting panels are formed, characterized in that a hole is provided in a desired region of the above described mother substrate or mother sealing plate which is located between adjacent light emitting portions, and air between the two substrates is released to the outside through the above described hole in the step of fabricating a layered body by making the above described mother substrate and mother sealing plate adhere to each other.

The present invention provides a manufacturing method for appropriate multiple panel taking for light emitting panels made of self-luminous light emitting elements, such as inorganic EL's, FED's and ECL's, in addition to organic EL's, and a hole that is connected to a space surrounded by the mother substrate, the mother sealing plate and the adhesive layer is formed in the mother substrate, and thereby, the above described space can be converted to an open space that is connected to the outside to the layered body via this hole, and therefore, a closed space surrounded by the mother substrate, the mother sealing plate and the adhesive layer can be prevented from being formed. As a result, a light emitting panel having excellent display quality can be formed. In addition, gas within the above described space is released to the outside through this hole, and thereby, the adhesive layer can be uniformly spread without creating a closed space in light emitting portions. Furthermore, a light emitting panel where no closed space as those described above is created, and thereby, a predetermined distance is maintained between the mother substrate and the mother sealing plate can be manufactured.

In addition, the adhesive can be uniformly spread, so that no closed space is formed in light emitting portions, and therefore, foreign substances, for example, moisture, can be prevented from seeping into the light emitting portions from the outside, and thus, the light emitting portions can be prevented from deteriorating.

In addition, in the case where no hole is provided, even when a necessary and sufficient amount of adhesive is applied, preventing lack of applied amount, there is a risk that a closed space may be locally formed in the layered body of the mother substrate and the mother sealing plate due to non-uniformity of the application of the adhesive layer, distortion, such as warping, of the mother substrate, or local unevenness in the pressing force. In this case, when a closed space is formed, even if only in one place, the distance between the mother substrate and the mother sealing plate becomes the height of the closed space, and the above described distance cannot be further narrowed, and therefore, a great number of defective light emitting panels where an adhesive layer cannot be uniformly spread over light emitting portions are created, and thus, a problem arises, such that the yield of manufacture is lowered. Accordingly, in accordance with the manufacturing method of the present invention, where a hole is provided as described above, such a problem where the yield of manufacture is lowered can be prevented.

As a result of this, a light emitting panel where light emitting properties and reliability are improved can be formed while preventing a reduction in the yield. Here, in the case of the present invention, it is possible to apply the manufacturing method to uniform screen light emitting panels, such as backlights, where light emission is not controlled for each pixels.

<Fourth Aspect of the Present Invention>

The fourth aspect of the present invention provides a manufacturing method for a display panel, wherein a plurality of display portions are formed on a mother substrate, a layered body where a mother sealing plate is made to adhere to the mother substrate via an adhesive layer so as to cover the number of display portions is formed, and the layered body is separated into pieces, each of which has a display portion, and thus a plurality of display panels are formed, characterized in that a hole is provided in a desired region of the above described mother substrate or mother sealing plate which is located between adjacent display portions, and air between the two substrates is released to the outside through the above described hole in the step of fabricating a layered body by making the above described mother substrate and mother sealing plate adhere to each other.

The present invention provides a manufacturing method which is appropriate for multiple panel taking for display panels made of self-luminous elements, such as inorganic EL's, FED's and ECL's, in addition to organic EL's, as well as polymer LCD's, which are non-self-luminous display elements, and a hole that is connected to a space surrounded by the mother substrate, the mother sealing plate and the adhesive layer is formed in the mother substrate or the mother sealing plate, and thereby, the above described space can be converted to an open space that is connected to the outside to the layered body via this hole, and therefore, a closed space surrounded by the mother substrate, the mother sealing plate and the adhesive layer can be prevented from being formed. As a result, a display panel having excellent display quality can be formed. In addition, gas within the above described space is released to the outside through this hole, and thereby, the adhesive layer can be uniformly spread without creating a closed space in display portions. Furthermore, a display panel where no closed space as those described above is created, and thereby, a predetermined distance is maintained between the mother substrate and the mother sealing plate can be manufactured.

In addition, the adhesive can be uniformly spread, so that no closed space is formed in display portions, and therefore, foreign substances, for example, moisture, can be prevented from seeping into the display portions from the outside, and thus, the display portions can be prevented from deteriorating.

In addition, in the case where no hole is provided, even when a necessary and sufficient amount of adhesive is applied, preventing lack of applied amount, there is a risk that a closed space may be locally formed in the layered body of the mother substrate and the mother sealing plate due to non-uniformity of the application of the adhesive layer, distortion, such as warping, of the mother substrate, or local unevenness in the pressing force. In this case, when a closed space is formed, even if only in one place, the distance between the mother substrate and the mother sealing plate becomes the height of the closed space, and the above described distance cannot be further narrowed, and therefore, a great number of defective display panels where an adhesive layer cannot be uniformly spread over light emitting portions are created, and thus, a problem arises, such that the yield of manufacture is lowered. Accordingly, in accordance with the manufacturing method of the present invention, where a hole is provided as described above, such a problem where the yield of manufacture is lowered can be prevented.

As a result of this, a display panel where light emitting properties and reliability are improved can be formed while preventing a reduction in the yield.

According to the fourth aspect of the present invention, the above described display portions are preferably made of organic electroluminescence elements.

In accordance with this manufacturing method, a hole that is connected to a space surrounded by the mother substrate, the mother sealing plate and the adhesive layer is formed in the mother substrate or the mother sealing plate, and thereby, the above described space can be converted to an open space that is connected to the outside to the layered body via this hole, and therefore, a closed space surrounded by the mother substrate, the mother sealing plate and the adhesive layer can be prevented from being formed. As a result, an organic electroluminescence display panel having excellent display quality can be formed. In addition, gas within the above described space is released to the outside through this hole, and thereby, the adhesive layer can be uniformly spread without creating a closed space in display portions. Furthermore, an organic electroluminescence display panel where no closed space as those described above is created, and thereby, a predetermined distance is maintained between the mother substrate and the mother sealing plate can be manufactured.

In addition, the adhesive can be uniformly spread, so that no closed spaces are formed in the organic electroluminescence display portions, and therefore, moisture can be prevented from seeping into the organic electroluminescence display portions, and the display portions can be prevented from deteriorating.

According to the present invention, the manufacturing method for a display panel is characterized in that the location of the hole that is preferably provided in the above described mother substrate or the above described mother sealing plate is provided in a region other than the above described light emitting panels or display panels, and in a region in which the above described adhesive layer is not applied.

In accordance with this manufacturing method, in the step of forming a layered body by making the mother sealing plate adhere to the mother substrate via an adhesive layer so as to cover the number of light emitting portions, display portions or organic electroluminescence display portions, the adhesive layer can be prevented from leaking out through the above described hole. In the case where a large amount of the adhesive layer leaks out through the above described hole, there is a possibility that the adhesion apparatus might be contaminated, and there is a risk that the yield of manufacture may be lowered if the adhesion step is carried out using such a contaminated adhesion apparatus. According to the present invention, such a reduction in the yield can be prevented.

According to the present invention, the above described hole is more preferably provided in a region where no adhesive layer exists between the mother substrate and the mother sealing plate in a state where the above described layered body has been formed.

In accordance with this manufacturing method, in the step of forming a layered body by making the mother sealing plate adhere to the mother substrate via an adhesive layer so as to cover the number of light emitting portions, display portions or organic electroluminescence display portions, the adhesive layer can be prevented from leaking out through the above described hole without failure. Therefore, according to the present invention, such a reduction in the yield can be prevented without failure.

<Fifth Aspect of the Present Invention>

The fifth aspect of the present invention provides a manufacturing method for an organic electroluminescence display panel, characterized by being provided with: a display portion forming step of forming a plurality of organic electroluminescence display portions on a mother substrate: a hole opening step of opening a hole in a predetermined location of a mother sealing plate for sealing the above described organic electroluminescence display portions; an adhesive applying step of applying an adhesive to the surface of the above described mother substrate so as to cover the above described organic electroluminescence display portions; a positioning step of positioning the above described mother substrate and the above described mother sealing plate in such a manner that the location of the hole that is provided in the above described mother sealing plate faces a region on the surface of the above described mother substrate in which the above described adhesive is not applied; a layered body fabricating step of fabricating a layered body for sealing the above described organic electroluminescence display portions by spreading the adhesive layer made of the above described adhesive between the above described mother substrate and the above described mother sealing plate, and releasing air between the above described mother substrate and the above described mother sealing plate to the outside through the above described hole; and a separation step of separating the layered body into pieces, each of which has an organic electroluminescence display portion, and thus, gaining a plurality of organic electroluminescence display panels.

In accordance with this manufacturing method, a hole that is connected to a space surrounded by the mother substrate, the mother sealing plate and the adhesive layer is formed in the mother substrate, and thereby, the above described space can be converted to an open space that is connected to the outside to the layered body via this hole, and therefore, air in the space can be released to the outside through the hole. As a result, an organic electroluminescence display panel having excellent display quality can be formed. In addition, gas within the above described space is pushed out to the outside through this hole, and thereby, the adhesive layer can be uniformly spread without creating a closed space in display portions. Furthermore, an organic electroluminescence display panel where no closed space as those described above is created, and thereby, a predetermined distance is maintained between the mother substrate and the mother sealing plate can be manufactured.

In addition, the adhesive can be uniformly spread, so that no closed spaces are formed in the organic electroluminescence display portions, and therefore, moisture can be prevented from seeping into the organic electroluminescence display portions, and the display portions can be prevented from deteriorating.

As a result, an organic electroluminescence display panel where improvement of light emitting properties and reliability can be achieved while preventing reduction in the yield can be formed.

<Sixth Aspect of the Present Invention>

The sixth aspect of the present invention provides a manufacturing method for an organic electroluminescence display panel, provided with: the step of providing a plurality of organic electroluminescence display portions and terminal portions placed in the proximity of the respective organic electroluminescence display portions so as to supply a signal to each organic electroluminescence display portion together on a mother substrate; a partition forming step of forming partitions between the above described organic electroluminescence display portions and the above described terminal portions; a hole opening step of opening a hole in a predetermined location of a mother sealing plate for sealing the above described organic electroluminescence display portions; an adhesive applying step of applying an adhesive to the above described organic electroluminescence display portions on the surface of the above described mother substrate except for the above described terminal portions and the above described partitions; a layered body fabricating step of layering the above described mother sealing plate on the above described mother substrate via the above described adhesive so that the location of the above described hole that is provided in the above described mother sealing plate faces a region on the surface of the above described mother substrate in which the above described adhesive is not applied, and thereby, spreading the above described adhesive between the two substrates; and a separation step of separating the layered body into pieces, each of which has an organic electroluminescence display portion, and thus, gaining a plurality of organic electroluminescence display panels, characterized in that, in the above described step of fabricating a layered body, the above described partitions prevent the above described adhesive from reaching the above described terminal portions, so that air between the above described mother substrate and the above described mother sealing plate is released to the outside through the above described hole.

In accordance with this manufacturing method, a hole that is provided in the mother sealing plate exists in a space surrounded by the mother substrate, the mother sealing plate and the adhesive layer so as to convert the space into an open space while the partitions prevent the adhesive from reaching the terminal portions, and therefore, the adhesive is prevented from adhering to the terminal portions and a closed space surrounded by the mother substrate, the mother sealing plate and the adhesive layer can be prevented from being formed. Accordingly, the adhesive layer can be uniformly spread by pushing the air within the above described space out to the outside through the above described hole without making the adhesive adhere to the terminal portions. Furthermore, no closed space is created, as described above, and therefore, the distance between the mother substrate and the mother sealing plate can be narrowed.

As a result, the cleaning step which is required in the case where an adhesive adheres to the terminal portions becomes unnecessary, and reduction in the yield resulting from such a cleaning step can be prevented, and thus, an organic electroluminescence display panel having excellent display quality can be formed.

In addition, the adhesive can be uniformly spread, so that no closed spaces are formed in the organic electroluminescence display portions, and therefore, moisture can be prevented from seeping into the organic electroluminescence display portions, and the display portions can be prevented from deteriorating.

<Seventh Aspect of the Present Invention>

The seventh aspect of the present invention provides the manufacturing method for a panel according to any of the third to sixth aspects, characterized in that the above described layered body fabricating step is carried out under atmospheric pressure.

By using such a sealing method, it becomes unnecessary to carry out an adhesion step within a vacuum chamber, and therefore, a larger scale mother substrate can be utilized, so that a greater number of panels can be gained from multiple panel taking, without being limited by the size of the vacuum chamber.

According to the third to seventh aspects of the present invention, in the step of making the mother substrate and the mother sealing plate adhere to each other, no closed space surrounded by the mother substrate, the mother sealing plate and the adhesive layer is formed, a desired distance is maintained between the mother substrate and the mother sealing plate, and thereby, the adhesive layer can be uniformly spread in the light emitting portions or display portions between these two substrates. Accordingly, a light emitting panel or display panel where the display quality is high and reduction in the light emitting properties and reliability of the light emitting portions or display portions can be prevented, and therefore, display quality is high, light emitting properties are excellent and reliability is improved, can be manufactured, and an increase in the yield of manufacture can be expected.

DESCRIPTION OF THE PREFERRED EMBODIMENTS

The embodiments according to the first and second aspects of the present invention are described in the following in reference to the drawings.

Embodiment 1

Figure 1:
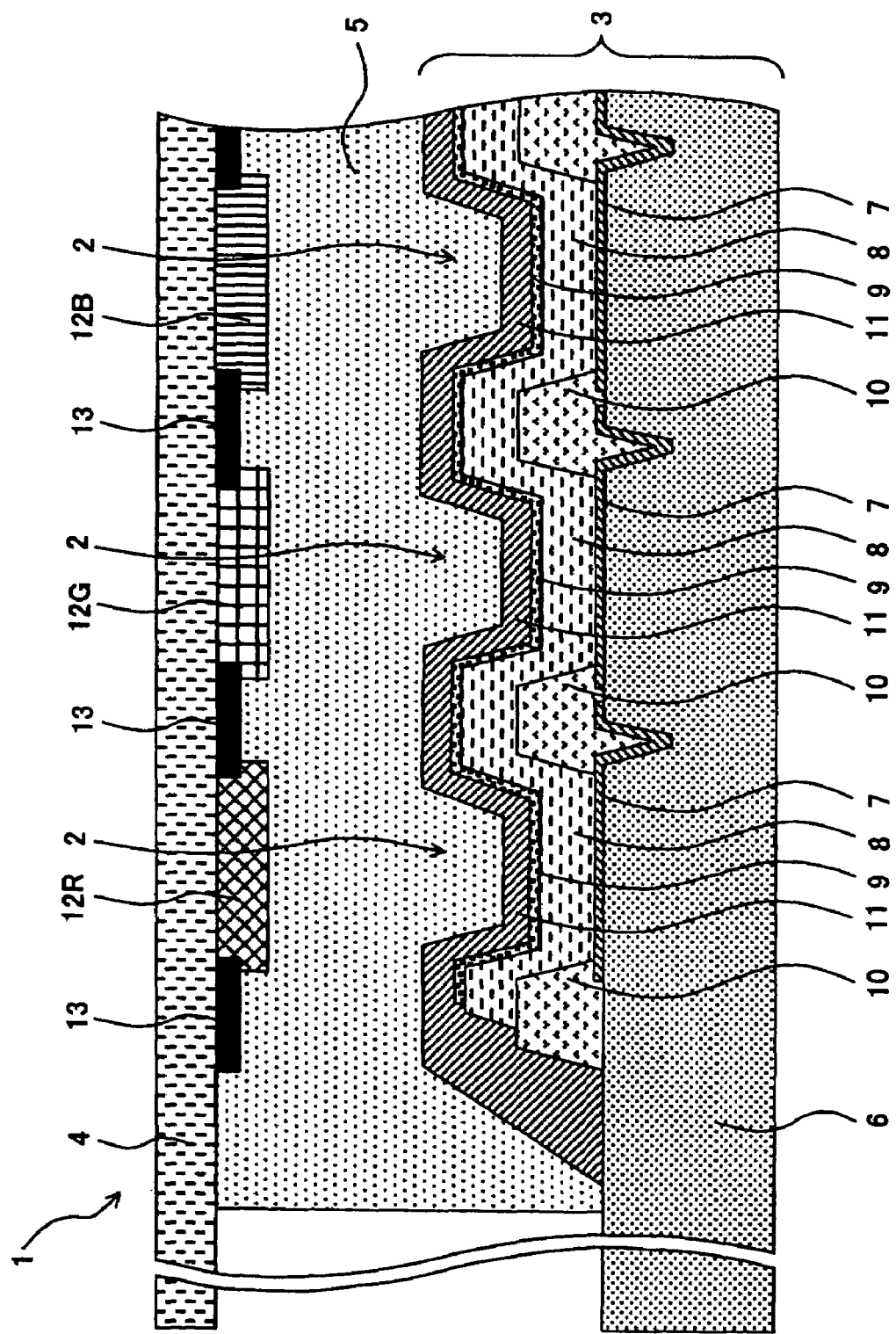
FIG. 1 is a schematic cross sectional diagram showing the configuration of an organic EL panel according to Embodiment 1.
Figure 2:
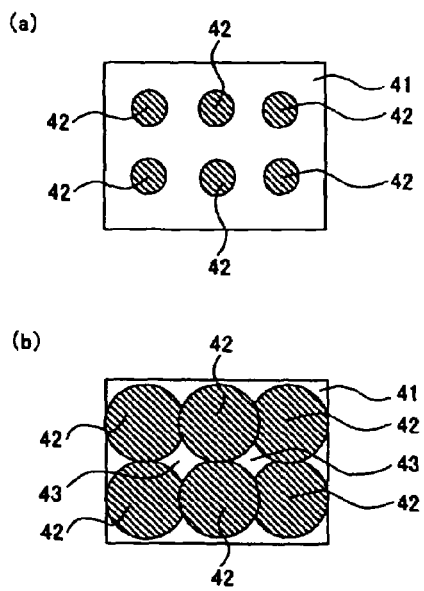
FIGS. 2(a) and 2(b) are schematic top plan diagrams illustrating a method for sealing an EL panel according to the prior art.

First, the structure of an organic EL panel that is fabricated using the sealing method according to the present embodiment is described in reference to the schematic cross sectional diagram of FIG. 1.

1-1. Configuration of Entirety of Organic EL Panel

FIG. 1 is a schematic cross sectional diagram illustrating the configuration of an organic EL panel that has been fabricated using the sealing method according to the present embodiment.

In reference to FIG. 1, an organic EL panel 1 is formed by making an organic EL substrate 3 and a sealing substrate 4 for sealing adhere to each other by means of an adhesive 5 for sealing.

The organic EL substrate 3 is formed of a plurality of organic EL elements 2, 2 . . . which are placed on a TFT substrate 6 on which TFT's for driving are placed.

In addition, the sealing substrate 4 is formed of a translucent material having color filters 12R, 12G and 12B for red (R), green (G) and blue (B) on the surface facing the organic EL elements 2. Furthermore, a black matrix 13 is placed between the adjacent color filters.

In addition, according to the present embodiment, the number of organic EL elements 2, 2 . . . are formed so as to emit white light, and the white light that has been emitted from the respective organic EL elements 2, 2 . . . is taken out to the outside through color filters 12R, 12G and 12B for R, G and B. As described above, the present embodiment provides the configuration of top emission, where light emitted from the organic EL elements 2, 2 . . . is taken out from the sealing substrate 4 side.

As shown in FIG. 1, each of the organic EL elements 2, 2 . . . is formed in such a manner that an anode 7, an organic layer 8 and a cathode 9 are layered in this order starting from the TFT substrate 6 side. Adjacent organic EL elements 2, 2 are separated by a cell separating film 10 made of an insulating material.

An anode 7 is formed of a metal compound, such as, for example, ITO (indium-tin oxide), and a light reflecting material made of a metal or an alloy, such as Ag (silver) may be placed beneath the metal compound. In addition, such anodes 7 are formed so as to be separated from each other for the respective organic EL elements 2, 2 . . . .

The cathode 9 is formed of a light transmitting material made of, for example, a metal compound, such as ITO, a metal or an alloy. According to the present embodiment, as shown in FIG. 1, the cathode 9 is continuous and formed so as to cover the respective organic EL elements 2, 2 . . . so as to work as a common cathode for the respective organic EL elements 2, 2 . . . .

In addition, the cathode 9 is covered with a protective film 11 made of an inorganic material, such as SiN (silicon nitride).

The organic layer 8 has a structure of (anode)/hole transferring layer/light emitting layer/electron transferring layer/(cathode) and is formed, for example, in such a manner that the hole transferring layer, the light emitting layer and the electron transferring layer are layered in this order starting from the anode 7 side. However, the structure of the organic layer is not limited to this, and structures such as (anode)/light emitting layer/(cathode), (anode)/hole injection layer/light emitting layer/(cathode), (anode)/light emitting layer/electron injection layer/(cathode), (anode)/hole injection layer/light emitting layer/electron injection layer/(cathode), (anode)/hole injection layer/hole transferring layer/light emitting layer/electron injection layer/(cathode), (anode)/hole injection layer/hole transferring layer/light emitting layer/electron transferring layer/electron injection layer/(cathode) are possible.

According to the present embodiment, the light emitting layer has a two-layer structure where, for example, a light emitting layer for emitting blue light and a light emitting layer for emitting orange light are layered so as to emit white light.

In addition, though according to the present embodiment, white light that has been emitted from the light emitting layer is taken out to the outside through color filters, so that light of three colors, red, green and blue, can be gained in the structure, three types of layers, a red light emitting layer, a green light emitting layer and a blue light emitting layer for emitting red, green and blue lights may be applied separately so that lights of three colors, red, green and blue, can be gained in the structure.

Furthermore, in the figure, the adhesive 5 is made of an ultraviolet ray curing resin, a visible light curing resin, a thermosetting resin, a complex curing resin which is cured by ultraviolet rays and heat, or a delayed curing resin which is cured by ultraviolet rays. Here, in the case where a sealing substrate 4 having a color filter or a CCM (color changing media) is used, ultraviolet rays can not transmit through the filter portion, and therefore, a thermosetting resin, a visible light curing resin or a post curing resin which is cured by ultraviolet rays is used.

Concretely, as the adhesive 5, thermosetting resins, such as urea resins, melamine resins, phenol resins, resorcinol resins, epoxy resins, unsaturated polyester resins, polyurethane resins and acryl resins, thermoplastic resins, such as vinyl acetate resins, ethylene-vinyl acetate copolymer resins, acryl resins, cyano acrylate resins, polyvinyl alcohol resins, polyamide resins, polyolefin resins, thermoplastic polyurethane resins, saturated polyester resins and cellulose based resins, radical based light curing adhesives using resins, such as any acrylate from a variety of types, including ester acrylate, urethane acrylate, epoxy acrylate, melamine acrylate and acryl resin acrylate, as well as urethane polyester, cation based light curing adhesives using resins such as epoxy and vinyl ether, adhesives made of resins to which thiol/ene has been added, rubber based adhesives, such as chloroprene rubber based adhesives, nitrile rubber based adhesives, styrene/butadiene rubber based adhesives, natural rubber based adhesives, butyl rubber based adhesives and silicone based adhesives, or complex synthetic polymer adhesives, such as vinyl-phenolic resins, chloroprene-phenolic resins, nitrile-phenolic resins, nylon-phenolic resins, epoxy-phenolic resins and nitrile-phenolic resins, are used.

1-2. Concerning the Characteristics of the Present Embodiment

A method for fabricating an organic EL panel as that shown in FIG. 1 using the sealing method according to the present embodiment is described in the following.

Figure 3:
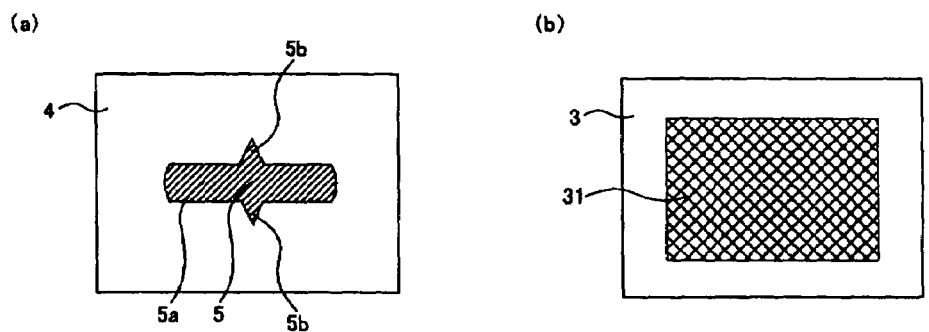
FIGS. 3(a) and 3(b) are schematic top plan diagrams illustrating a method for sealing organic EL elements according to Embodiment 1.

FIG. 3(a) is a schematic top plan diagram showing a sealing substrate (an example of the second substrate according to the present invention) 4 before it is pasted. In addition, FIG. 3(b) is a schematic top plan diagram showing an organic EL substrate (an example of the first substrate according to the present invention) 3, where a pixel portion 31 that includes organic EL elements is provided. Here, the first substrate 3 and the second substrate 4 respectively correspond to the organic EL substrate 3 and the sealing substrate 4 of FIG. 1.

According to the present embodiment, the adhesive 5 is applied in a shape having a straight line portion 5a and protruding portions 5b which protrude in the direction crossing the straight line portion in the vicinity of the center of the surface of the second substrate 4. It is preferable for the crossing point of the straight line portion 5a and the protruding portions 5b to be set in the vicinity of the center of the surface of the second substrate 4. The width of the adhesive 5 in the longitudinal direction is set so that the above described pixel portion 31 is completely covered with the adhesive 5 in a sealed state.

Next, the second substrate 4 and the first substrate 3 are pasted together with the surface on which the adhesive 5 has been applied facing inward. FIGS. 4 to 7 are schematic top plan diagrams illustrating the manner in which the adhesive 5 spreads between the above described first substrate 3 and second substrate 4 when the above described first substrate 3 and second substrate 4 are pressed against each other.

Figure 4:
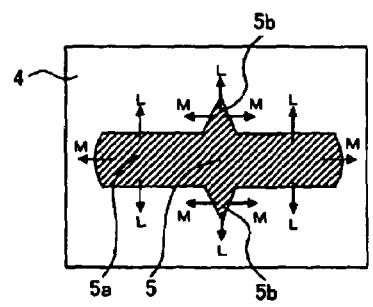
FIG. 4 is a schematic top plan diagram illustrating a method for sealing organic EL elements according to Embodiment 1.
Figure 5:
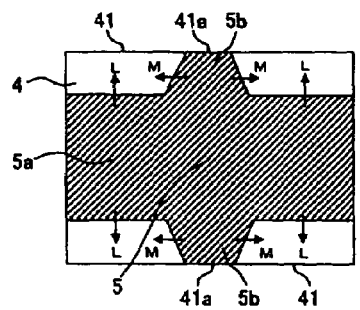
FIG. 5 is a schematic top plan diagram illustrating a method for sealing organic EL elements according to Embodiment 1.

When the first substrate 3 and the second substrate 4 are pasted together, the adhesive 5 spreads in the longitudinal direction (direction of arrows M) of the straight line portion 5a, as well as in the direction in which the protruding portions 5b protrude (direction of arrows L) (FIG. 4). Thus, the protruding portions 5b serve as guides in the direction of arrows L, so that the adhesive 5 spreads in the direction in which the protruding portions 5b protrude from the portions where the protruding portions 5b are formed so as to first reach center portions 41a, 41a of the two facing sides 41, 41 of the first substrate 3 and the second substrate 4. Therefore, at this stage, spaces remain in the four corners of the pair of substrates 3 and 4 (FIG. 5).

Figure 6:
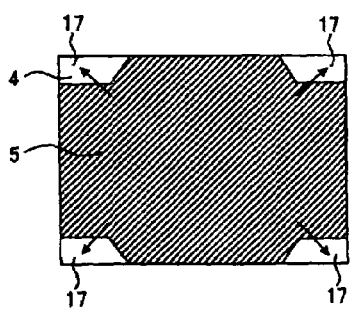
FIG. 6 is a schematic top plan diagram illustrating a method for sealing organic EL elements according to Embodiment 1.
Figure 7:
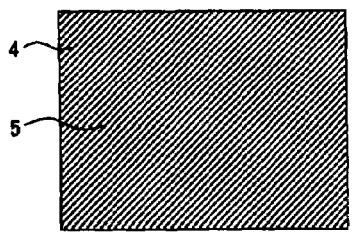
FIG. 7 is a schematic top plan diagram illustrating a method for sealing organic EL elements according to Embodiment 1.

In addition, when the pair of substrates 3 and 4 are kept being pressed together the adhesive 5 further spreads in the directions of arrows L and arrows M on the above described first substrate 3 and second substrate 4. After that, as shown in FIG. 6, the adhesive 5 spreads in such a manner that spaces are left in the four corners of the above described first substrate 3 and second substrate 4. That is to say, spaces 17 are pushed out to the four corners.

Furthermore, when the above described first substrate 3 and second substrate 4 are pressed against each other, as shown in FIGS. 7(a) and 7(b), the adhesive 5 spreads to the four corners of the above described first substrate and second substrate 4, and thus, the above described first substrate 3 and second substrate 4 can be made to adhere to each other without causing bubbles between the above described first substrate 3 and second substrate 4. That is to say, according to the present embodiment, the adhesive 5 spreads in the directions toward the four corners from the center portion of the above described first substrate 3 and second substrate 4, and thereby, no spaces from which air cannot escape are created between the above described first substrate 3 and second substrate 4, and therefore, the above described first substrate 3 and second substrate 4 can be made to adhere to each other without any bubbles being caused by such spaces. Accordingly, an organic EL display having excellent display quality and higher reliability can be manufactured.

All of the above described step of applying the adhesive 5, the step of pasting the first substrate 3 and the second substrate 4 together, and the step of spreading the adhesive 5 by pressing the pair of substrates 3 and 4 together may be carried out either under reduced pressure or under atmospheric pressure.

Here, the protruding portions 5b of the adhesive 5 may be applied in a shape having protruding portions in the direction crossing the straight line portion 5a of the adhesive 5, and the shape of these protruding portions is not limited. For example, a semicircular shape, a wedge shape, a linear shape and the like can be applied.

In addition, though in the above described embodiment, the adhesive 5 is applied to the surface of the second substrate 4, it may be applied to a surface of the first substrate 3.

Here, the adhesive 5 may be applied in such a manner as to form a pattern in the above described shape using a mask, may be applied in a pattern by means of screen printing, or may be applied by means of a dispenser.

Figure 8:
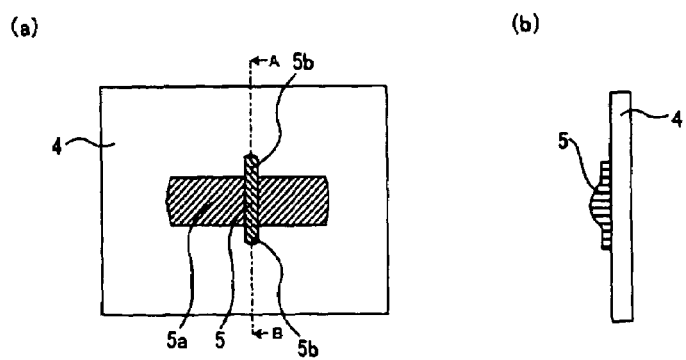
FIGS. 8(a) and 8(b) are a schematic top plan diagram and a schematic cross sectional diagram illustrating a method for sealing organic EL elements according to Embodiment 1.

In addition, according to a method for applying the adhesive 5, the protruding portions 5b may be applied in a shape having protruding portions on both ends, for example, in linear form, and subsequently, the straight line portion 5a may be applied in straight line form and in the direction crossing the above described protruding portions 5b. FIG. 8(a) is a schematic top plan diagram showing the sealing substrate (second substrate) 4 before it is pasted. As shown in FIG. 8(a), the protruding portions 5b and the straight line portion 5a cross each other at each center portion, and the two ends of the protruding portions 5b protrude from the sides of the straight line portion 5a. FIG. 8(b) is a cross sectional diagram schematically showing the cross section along line AB of FIG. 8(a). In this case, as shown in FIG. 8(b), the surface of the adhesive forms a convex shape in the portion where the straight line portion 5a and the protruding portions 5b cross each other.

Figure 9:
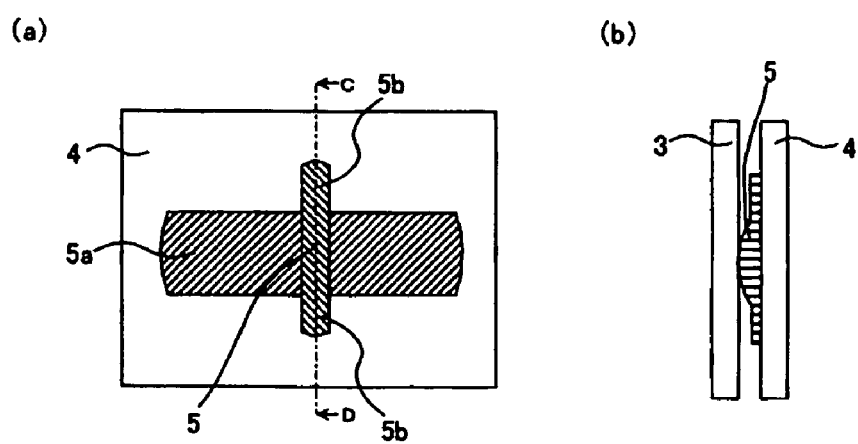
FIGS. 9(a) and 9(b) are a schematic top plan diagram and a schematic cross sectional diagram illustrating a method for sealing organic EL elements according to Embodiment 1.

Next, the second substrate 4 and the first substrate 3 are pasted together with the surface on which the adhesive 5 has been applied facing inward. FIG. 9(a) is a schematic top plan diagram for illustrating how the adhesive 5 spreads immediately after the pair of substrates, the first substrate 3 and the second substrate 4, have been pasted together. FIG. 9(b) is a cross sectional diagram schematically showing the cross section along line CD of FIG. 9(a). As shown in FIG. 9(b), the above described protrusion from the surface of the adhesive 5 makes first contact with the first substrate 3.

When the above described first substrate 3 and second substrate 4 are pressed against each other from the state of FIG. 9(b), the portion where the adhesive 5 and the first substrate 3 make contact with each other spreads starting from the dot portion, where the first substrate and the adhesive 5 make contact with each other, and therefore, bubbles due to the space caused in the case where the surface of the adhesive having undulation is made to adhere to the first substrate 3 can be prevented.

Here, according to a method for applying the adhesive 5, the straight line portion 5a may be applied first, and the protruding portions 5b in a shape having protruding portions on the two ends, for example, in a straight line form, may be applied next in the direction crossing the straight line portions 5a.

Embodiment 2

Next, Embodiment 2 of the present invention is described.

Figure 10:
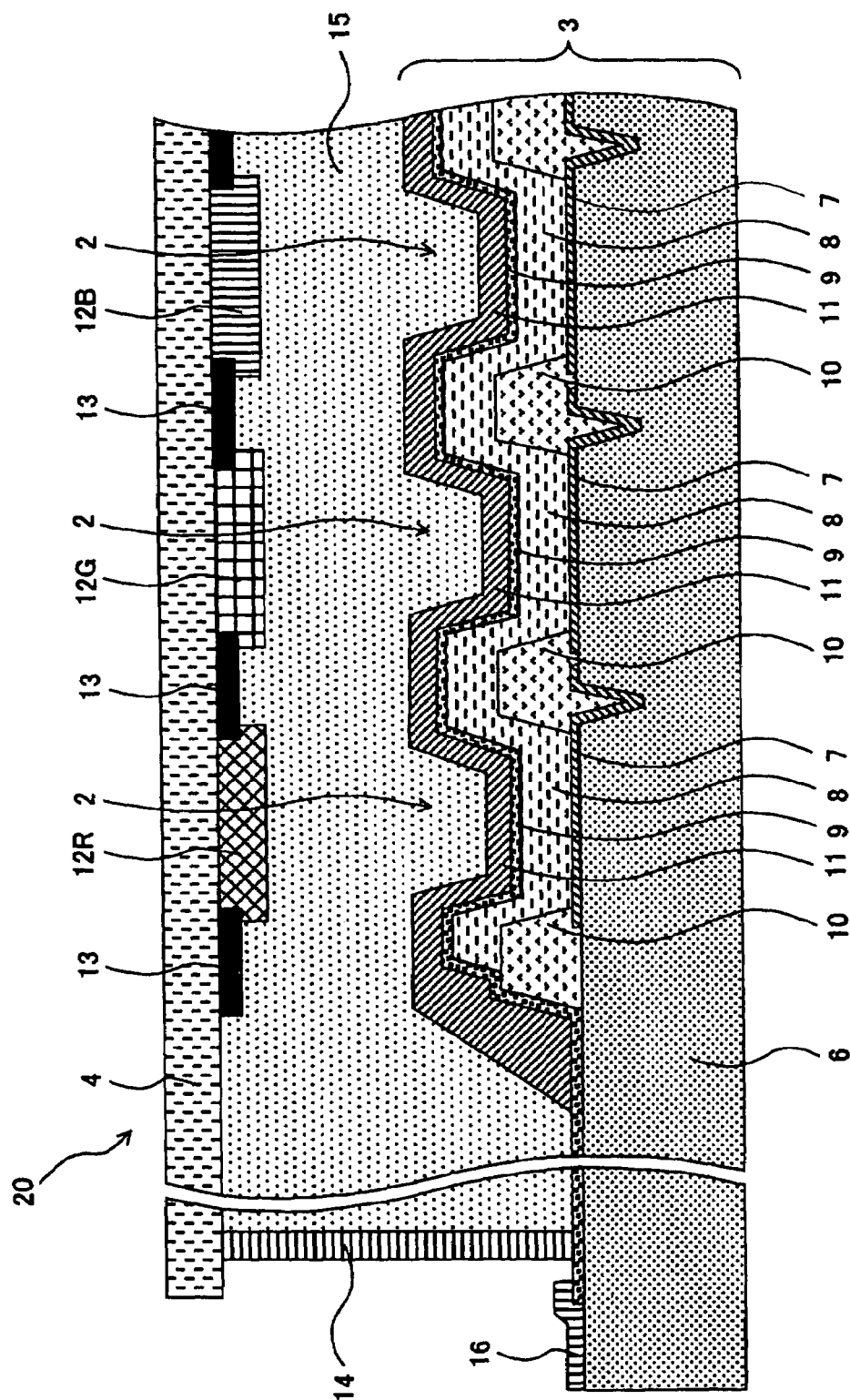
FIG. 10 is a schematic cross sectional diagram illustrating a method for sealing organic EL elements according to Embodiment 2.

First, the structure of an organic EL panel that has been fabricated using the sealing method according to the present embodiment is described in reference to the schematic cross sectional diagram shown in FIG. 10.

2-1. Configuration of Entirety of Organic EL Panel

FIG. 10 is a schematic cross sectional diagram illustrating the configuration of an organic EL panel that has been fabricated using the sealing method according to the present embodiment.

In reference to FIG. 10, an organic EL panel 20 is formed in such a manner that an organic EL substrate 3 and a sealing substrate 4 for sealing are made to adhere to each other with a first adhesive 14 and a second adhesive 15 for sealing.

The organic EL substrate 3 is formed of a plurality of organic EL elements 2, 2 . . . , an external circuit which is electrically connected to these organic EL elements 2, and a terminal portion 16 for sending an electrical signal to these organic EL elements 2, which are placed on a TFT substrate 6 on which TFT's for driving are placed. In addition, the entire collection of the number of organic EL elements 2, 2 . . . that have been formed on the TFT substrate 6 forms a pixel portion 31.

Thus, as shown in this figure, the pixel portion 31 is sealed between the organic EL substrate 3 and the sealing substrate 4 with the second adhesive 15 on top of the pixel portion 31 and is sealed between the pixel portion 31 and the terminal portion 16 with the first adhesive 14. Here, this second adhesive 15 is made of a material which is different from that of the first adhesive 14 and has a viscosity that is lower than that of the first adhesive 14.

The first adhesive 14 and the second adhesive 15 are similar to the adhesive 5 in Embodiment 1. Here, in the case where the used sealing substrate 4 has a color filter or a CCM (color converting layer), ultraviolet rays can not transmit through the filter portion, and therefore, an ultraviolet ray curing resin, a visible light curing resin, a thermosetting resin, a complex curing resin which is cured by ultraviolet rays and heat, or a post-curing resin which is cured by ultraviolet rays is used as the second adhesive 15, while a thermosetting resin, a visible light curing resin or a post-curing resin which is cured by ultraviolet rays is used as the first adhesive 14.

The used second adhesive 15 has a viscosity that is smaller than that of the first adhesive 14. Concretely, it is preferable for an adhesive of which the viscosity is 0.001 Pa·s to 10 Pa·s to be used as the second adhesive 15, and for an adhesive of which the viscosity is 10 Pa·s to 500 Pa·s to be used as the first adhesive 14.

Furthermore, it is more preferable for the ratio of the viscosity of the first adhesive to the viscosity of the second adhesive to be not less than 24.

In addition, an adhesive where a filler or a gap agent is added to the above described material may be used as the first adhesive 14. As examples of the filler that is added to the first adhesive 14, inorganic materials, such as $SiO_X$ (silicon oxide), SiON (silicon oxide nitride) and SiN (silicon nitride) and metal materials, such as Ag (silver), Ni (nickel) and Al (aluminum) can be cited. The first adhesive 14 to which a filler has been added has higher viscosity and resistance to moisture, compared to the first adhesive 14, to which no filler has been added. As the gap agent that is added to the first adhesive 14, a resin, in addition to the above described materials which may be used as a filler, may be used. The thickness of the layer of this first adhesive 14 can be made uniform by adding a gap agent to the first adhesive 14. In addition, the above described filler may be used as the gap agent.

The other parts are the same as those in Embodiment 1, and therefore, the descriptions thereof are omitted.

2-2. Concerning the Characteristics of the Present Embodiment

A method for fabricating an organic EL panel as shown in FIG. 10, using the sealing method according to the present embodiment, is described in the following.

Figure 11:
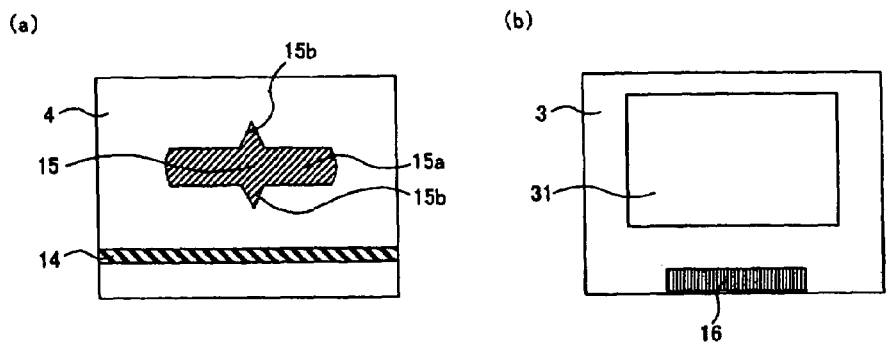
FIGS. 11(a) and 11(b) are schematic top plan diagrams illustrating a method for sealing organic EL elements according to Embodiment 2.

FIG. 11(a) is a schematic top plan diagram showing a sealing substrate (an example of the second substrate according to the present invention) 4 before pasting. In addition, FIG. 11(b) is a schematic top plan diagram showing an organic EL substrate (an example of the first substrate according to the present invention) 3, to which a pixel portion 31 that includes organic EL elements and a terminal portion 16 have been provided. The terminal portion 16 is a portion for electrically connecting the organic EL elements to an external circuit and transmitting an electrical signal to the organic EL elements. Here, the first substrate 3 and the second substrate 4 correspond to the organic EL substrate 3 and the sealing substrate 4 in FIG. 10, respectively.

In the present embodiment, a first adhesive 14 is applied in straight line form in a location on the surface of the second substrate 4 that corresponds to the location between the pixel portion 31 and the terminal portion 16 of the first substrate 3, and a second adhesive 15 is applied in a form having a straight line portion 15a and protruding portions 15b which protrude in the direction crossing the straight line portion is applied to the vicinity of a location on the surface of the second substrate 4 that corresponds to the center of the pixel portion 31 on the first substrate 3. It is preferable for the point where the straight line portion 15a and the protruding portions 15b cross to be set in the vicinity of a location that corresponds to the center of the pixel portion 31 on the first substrate 3. The width of the second adhesive 15 in the longitudinal direction is set so that the above described pixel portion 31 is completely covered, in a state where it is sealed with the second adhesive. In addition, the width of the first adhesive 14 in the longitudinal direction is set so that the second adhesive 15 does not spread to the above described terminal portion 16 in a state where it is sealed with the first adhesive. The width of the first adhesive 14 in the longitudinal direction is, for example, set to a length that is greater than the width of the second adhesive 15 in the longitudinal direction.

Next, the second substrate 4 and the first substrate 3 are pasted together with the surface to which the second adhesive 15 has been applied facing inward. FIGS. 12 to 15 are schematic top plan diagrams showing the manner in which the first adhesive 14 and the second adhesive 15 spread between the above described first substrate 3 and second substrate 4 when the above described first substrate 3 and second substrate 4 are pressed against each other.

Figure 12:
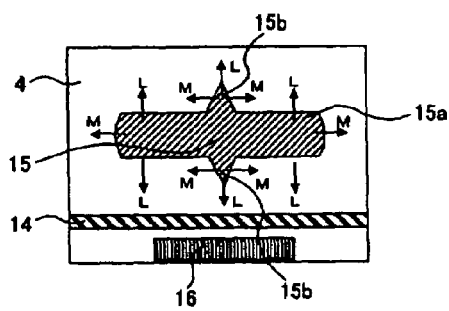
FIG. 12 is a schematic top plan diagram illustrating a method for sealing organic EL elements according to Embodiment 2.
Figure 13:
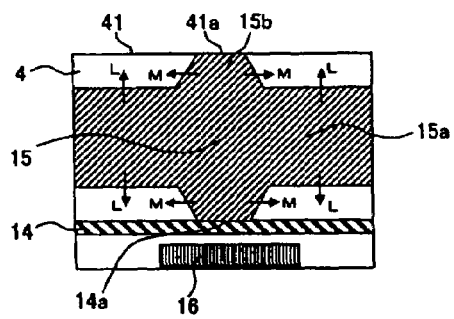
FIG. 13 is a schematic top plan diagram illustrating a method for sealing organic EL elements according to Embodiment 2.

When the first substrate 3 and the second substrate 4 are pasted together, the first adhesive 14 has the viscosity higher than that of the second adhesive 15, and therefore, barely spreads. In contrast, the second adhesive 15 spreads in the longitudinal direction of the straight line portion 15a (direction of arrows M) and in the direction in which the protruding portions 15b protrude (direction of arrows L) (FIG. 12). In addition, the second adhesive 15 spreads in the direction in which the protruding portions 15b protrude from the portions where the protrusions are formed, where the protruding portions 15b serve as guides for the second adhesive 15 in the direction of arrows L, and the second adhesive 15 first reaches the center portion 14a of the first adhesive 14 in the longitudinal direction, and the center portion 41a of sides 41 of the first substrate 3 and the second substrate 4, which face the first adhesive 14. Therefore, at this stage, spaces remain in the four corners of the pair of substrates 3 and 4 (FIG. 13).

Figure 14:
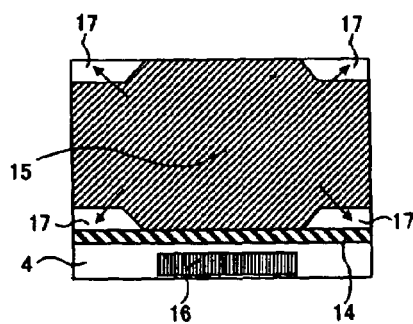
FIG. 14 is a schematic top plan diagram illustrating a method for sealing organic EL elements according to Embodiment 2.

When the pair of substrates 3 and 4 are further kept being pressed together, the second adhesive 15 further spreads in the direction of arrows L and in the direction of arrows M on the above described first substrate 3 and second substrate 4. In addition, the first adhesive 14 barely spreads, and therefore, does not make contact with the terminal portion 16. Furthermore, the second adhesive 15 has the viscosity lower than that of the first adhesive 14, and therefore, does not spread in the direction toward the terminal portion 16 by flowing over the first adhesive 14. That is to say, the first adhesive 14 blocks the second adhesive 15. In addition, the second adhesive 15 spreads in the direction of arrows M along the first adhesive 14 in the vicinity of the first adhesive 14. After that, as shown in FIG. 14, the second adhesive 15 spreads in such a manner that spaces remain in the four corners of the above described first substrate 3 and second substrate 4. That is to say, spaces 17 are pushed out toward these four corners.

Figure 15:
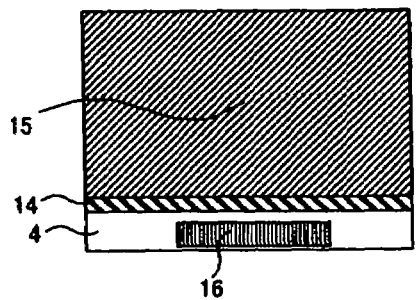
FIG. 15 is a schematic top plan diagram illustrating a method for sealing organic EL elements according to Embodiment 2.

When the above described first substrate 3 and second substrate 4 are further pressed against each other, as shown in FIG. 15, the second adhesive 15 spreads to the four corners of the above described first substrate 3 and second substrate 4, and thus, the above described first substrate 3 and second substrate 4 can be made to adhere to each other without creating any bubbles between the above described first substrate 3 and second substrate 4. That is to say, according to the present embodiment, the adhesive 15 spreads in the direction toward the four corners from the center portion of the above described first substrate 3 and second substrate 4, and thereby, no spaces from which air cannot escape are created between the above described first substrate 3 and second substrate 4, and thus, the above described first substrate 3 and second substrate 4 can be made to adhere to each other without any bubbles being created as a result of such spaces.

In addition, when the above described first substrate 3 and second substrate 4 are pressed against each other, the first adhesive 14 has a high viscosity and barely spreads, and therefore, does not make contact with the terminal portion 16 when the above described first substrate 3 and second substrate 4 are made to adhere to each other. Furthermore, the second adhesive 15, of which the viscosity is lower than that of the first adhesive 14, does not spread over the first adhesive 14, and therefore, does not make contact with the terminal portion 16 when the above described first substrate 3 and second substrate 4 are made to adhere to each other.

In addition, in the case where the ratio of the viscosity of the above described first adhesive 14 to the viscosity of the above described second adhesive 15 is not less than 24, the second adhesive 15 can spread along the above described first adhesive 14, and thus, the occurrence of bubbles can be prevented without failure in the step of spreading the above described first adhesive 14 and second adhesive 15 between the above described first substrate and second substrate, by pressing the above described first substrate 3 and second substrate 4 against each other. Furthermore, the second adhesive 15 can be prevented from spreading over the first adhesive 14 and making contact with the terminal portion, and in addition, the first adhesive 14 can be prevented from being attached to the terminal portion as a result of change in the form of the first adhesive 14, such that it spreads toward the above described terminal portion 16 side by being pushed by the second adhesive 15 when the second adhesive 15 spreads between the above described first substrate 3 and second substrate 4.

Each of the step of applying the above described first adhesive 14 and second adhesive 15, the step of pasting the first substrate 3 and the second substrate 4 together, and the step of spreading the adhesives by pressing the pair of substrates 3 and 4 against each other may be carried out either under reduced pressure or under atmospheric pressure.

Here, the protruding portions 15b of the second adhesive 15 may be applied in a form having protruding portions in the direction crossing the straight line portion 15a of the second adhesive 15, and the length of these protruding portions is not limited, and the higher the viscosity of the first adhesive 14 is, the closer to the first adhesive 14 the protruding portions 15b of the second adhesive 15 can be applied.

In addition, the first adhesive 14 and the second adhesive 15 may be applied in a pattern having the above described shape using a mask, may be applied in a pattern by means of screen printing, or may be applied using a dispenser.

In addition, in accordance with a method for applying the second adhesive 15, the protruding portions 15b are applied in a form having protruding portions on both ends, for example, in straight line form, and subsequently, the straight line portion 15a may be applied in straight line form in the direction crossing the above described protruding portions 15b, in the same manner as in the case of Embodiment 1

In addition, the first adhesive 14 may have a shape where the first adhesive 14 does not make contact with the terminal portion 16, the pixel portion 31 is completely covered with the second adhesive 15, and the second adhesive 15 also does not make contact with the terminal portion 16 in a state where they are sealed.

In addition, the first adhesive 14 may have such a viscosity that first adhesive 14 can block the spread of the second adhesive 15, and thereby, prevent the second adhesive 15 from making contact with the terminal portion 16 in a state where they are sealed.

In addition, though a case where the first adhesive 14 is applied in straight line form in a location on the surface of the second substrate 4 that corresponds to a location between the pixel portion 31 and the terminal portion 16 on the first substrate 3 is described in the above, it is preferable to further apply a third adhesive in straight line form in a location on the surface of the second substrate 4 that faces the first adhesive 14 with a location that corresponds to the pixel portion 31 of the first substrate 3 intervening.

In the case where the third adhesive is applied in addition to the first adhesive 14 and the second adhesive 15, as described above, the surface of the second substrate 4 is prevented from inclining relative to the surface of the first substrate 3 when the first substrate 3 and the second substrate 4 are pressed against each other, and therefore, the second substrate 4 and the first substrate 3 can be pasted together, so that the surfaces thereof are parallel to each other. Accordingly, an organic EL display having excellent display quality can be fabricated.

It is preferable for the third adhesive to have a viscosity that is as high as that of the first adhesive 14, and to be applied so as to have a thickness that is approximately the same as the thickness of the first adhesive 14. It is more preferable for a material that is the same as that of the first adhesive 14 to be used as the third adhesive.

In addition, an adhesive to which a filler or a gap agent which are the same as those for the first adhesive 14 has been added may be used as the third adhesive.

EXAMPLE 1

In the following, an example of an organic EL panel 1 that has been fabricated in accordance with a sealing method of the above described Embodiment 1 is described.

Figure 16:
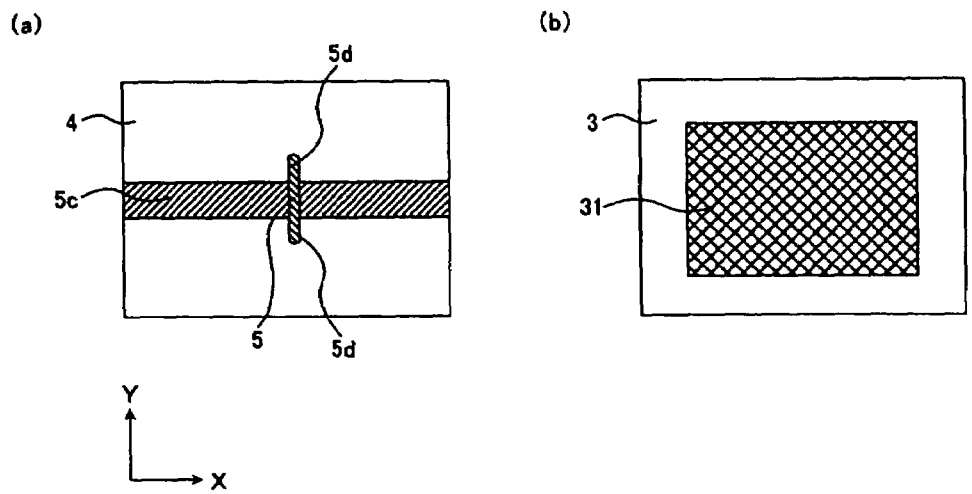
FIGS. 16(a) and 16(b) are schematic top plan diagrams illustrating a method for sealing organic EL elements according to Example 1.

Organic EL elements 2, 2 . . . were formed on a TFT substrate 6, and thereby, an organic EL substrate 3 was fabricated. FIG. 16(*a*) is a top plan diagram schematically showing a state where an adhesive 5 has been applied to the surface of a sealing substrate 4. Here, in FIG. 16(*a*), two directions which are perpendicular to each other are referred to as direction X and direction Y. The direction X and the direction Y are directions parallel to the surface of the sealing substrate 4. The dimensions of this sealing substrate 4 are 40 mm in the longitudinal direction×45 mm in the lateral direction. In addition, FIG. 16(*b*) is a top plan diagram schematically showing the organic EL substrate 3 and the location of the region of a pixel portion 31 that has been formed on the surface of the organic EL substrate. The dimensions of this organic EL substrate 3 are 40 mm in the longitudinal direction×45 mm in the lateral direction, and the dimensions of the pixel portion 31 are 27 mm in the longitudinal direction×37 mm in the lateral direction.

As shown in FIG. 16(*a*), an ultraviolet ray curing epoxy resin, which was used as the adhesive 5, was applied in straight line form in the direction Y so as to form a longitudinal line portion 5d, and applied in straight line form in the direction X so as to form a lateral line portion 5c by means of a dispenser on the surface of the sealing substrate 4 on the side where color filters 12R, 12G and 12B as well as a black matrix 13 have been provided. Concretely, the longitudinal line portion 5d and the lateral line portion 5c were applied by means of a dispenser of which the diameter of the discharge opening was 0.4 mm under atmospheric pressure within a chamber in which pressure could be reduced. Here, the longitudinal line portion 5d was applied at a rate of 30 mm/sec with a discharge pressure of 0.05 MPa, and the lateral line portion 5c was applied under four types of application conditions shown in Table 1 (for example, at a rate of 20 mm/sec and with a discharging pressure of 0.1 MPa under Application Condition 1). Here, the length of the longitudinal line portion 5d was 10 mm for all of the four types of application conditions.

Next, the sealing substrate 4 to which the above described adhesive 5 had been applied and the organic EL substrate 3 were pasted together under reduced pressure of 0.8 atm within the chamber in which pressure could be reduced. When this pasting was carried out, the organic EL elements 2, 2 . . . that had been placed on the organic EL element substrate 3 and the color filters 12R, 12G and 12B that had been placed on the sealing substrate 4 were aligned using a CCD camera or the like so that their locations corresponded to each other.

Next, the pressure within the chamber was increased to 1 atm, and this pressure was maintained for 1 minute, and thereby, the sealing substrate 4 and the organic EL substrate 3 were pressed against each other. After that, the sealing substrate 4 and the organic EL element substrate 3, which had been pasted together with the above described adhesive 5, were irradiated with ultraviolet rays under predetermined conditions, and thereby, this adhesive 5 was cured. Subsequently, the pasted substrate was taken out from the chamber.

Table 1 shows the conditions of the adhesive 5 when applying the lateral line portion 5c and the results when checking the state of sealing in the organic EL panel 1 after pasting.

TABLE 1

| Application Conditions | Discharging Pressure (MPa) | Discharging Rate (mm/sec) | Sealing State of Organic EL Panel after Pasting |
|---|---|---|---|
| Condition 1 | 0.05 | 30 | Adhesive did not Spread Throughout the Entirety of Substrate |
| Condition 2 | 0.1 | 50 | Same as Above |
| Condition 3 | 0.1 | 30 | Same as Above |
| Condition 4 | 0.1 | 20 | Adhesive had Spread Throughout the Entirety of Substrate |

The amount of application of the adhesive 5 in the lateral line portion 5*c* under Application Conditions 1 to 4, increases in the order of 1, 2, 3 and 4. Under Application Conditions 1, 2 and 3, the adhesive 5 did not spread throughout the entirety of the sealing substrate 4 and the organic EL element substrate 3 under the above described pressing conditions, and spaces remained in the four corners of this substrate. In contrast, under Application Condition 4, the adhesive 5 had spread throughout the entirety of the sealing substrate 4 and the organic EL element substrate 3 under the above described pressing conditions.

When the organic EL panel 1 that had been fabricated under Application Condition 4 was observed using an optical microscope, no bubbles were found throughout the entirety of the organic EL panel 1.

In the above described example, the sealing substrate 4 to which the adhesive 5 had been applied and the organic EL substrate were pasted together under reduced pressure, whereas the same results were obtained even when such pasting was carried out under atmospheric pressure.

As described above, an organic EL panel having no bubbles could be fabricated according to the present invention by appropriately adjusting the amount of the adhesive.

Furthermore, an organic EL display having no bubbles and excellent display quality could be fabricated using the organic EL panel that had been fabricated in accordance with the above described method.

EXAMPLE 2

Next, in the following, an example of an organic EL panel 20 that has been manufactured using the sealing method of the above described Embodiment 2 is described.

Figure 17:
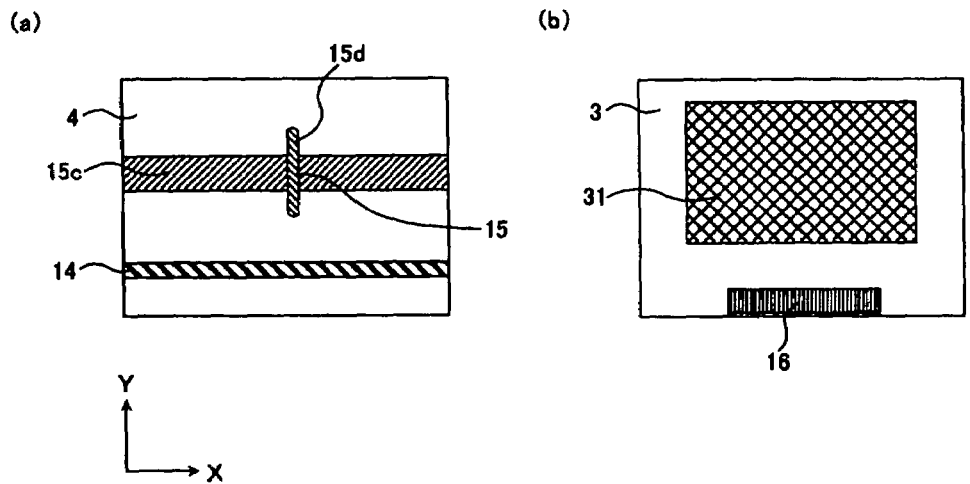
FIGS. 17(a) and 17(b) are schematic top plan diagrams illustrating a method for sealing organic EL elements according to Example 2.

Organic EL elements 2, 2 . . . were formed on a TFT substrate 6, and then, an organic EL substrate 3 was fabricated. FIG. 17(*a*) is a top plan diagram schematically showing a state where a first adhesive 14 and a second adhesive 15 had been applied to the surface of a sealing substrate 4. Here, in FIG. 17(*a*), two directions which are perpendicular to each other are referred to direction X and direction Y. The direction X and the direction Y are directions which are parallel to the surface of the sealing substrate 4. The dimensions of the sealing substrate 4 are 40 mm in the longitudinal direction×45 mm in the lateral direction. Here, the dimensions of a terminal portion 16 are 2 mm in the longitudinal direction×30 mm in the lateral direction, and the terminal portion 16 is placed along the long sides of the sealing substrate 4. In addition, FIG. 17(*b*) is a top plan diagram schematically showing the organic EL substrate 3 and the location of the region of a pixel portion 31 that has been formed on the surface of the organic EL substrate. The dimensions of this organic EL substrate 3 are 40 mm in the longitudinal direction x 45 mm in the lateral direction, and the dimensions of the pixel portion 31 are 27 mm in the longitudinal direction×37 mm in the lateral direction. In addition, the two facing long sides of the pixel portion 31 are placed at locations which are 4 mm and 9 mm away from the two facing long sides of the organic EL substrate 3, respectively.

As shown in FIG. 17(*a*), an ultraviolet ray curing epoxy resin, which was used as the first adhesive 14, of which the viscosity is 170 Pa·s and where a gap agent made of resin balls (beads) having a diameter of 10 μm was dispersed, was applied by means of a dispenser in the direction X to the surface of the sealing substrate 4 on the side where color filters 12R, 12G and 12B as well as a black matrix 13 were provided. The first adhesive 14 was applied to a location 5 mm away from a long side of the sealing substrate 4 in the direction Y. Next, an ultraviolet ray curing epoxy resin, which was used as the second adhesive 15 and of which the viscosity was 4.5 Pa·s, was applied in straight line form in the direction Y so as to form a longitudinal line portion 15*d*, and applied in straight line form in the direction X so as to form a lateral line portion 15*c* by means of a dispenser. Concretely, the longitudinal line portion 15*d* and the lateral line portion 15*c* were applied under atmospheric pressure by means of a dispenser of which the diameter of a discharging opening was 0.4 mm within a chamber in which pressure could be reduced. Here, the longitudinal line portion 15*d* was applied at a rate of 30 mm/sec with a discharge pressure of 0.05 MPa, and the lateral line portion 15*c* was applied under four types of application conditions shown in Table 1 (for example, at a rate of 20 mm/sec and with a discharging pressure of 0.1 MPa under Application Condition 1). Here, the length of the longitudinal line portion 15*d* was 10 mm for all of the four types of application conditions.

Next, the sealing substrate 4 to which the above described first adhesive 14 and second adhesive 15 had been applied and the organic EL substrate 3 were pasted together under reduced pressure of 0.8 atm within the chamber in which pressure could be reduced. When this pasting was carried out, the organic EL elements 2, 2 . . . that had been placed on the organic EL element substrate 3 and the color filters 12R, 12G and 12B that had been placed on the sealing substrate 4 were aligned using a CCD camera or the like so that their locations corresponded to each other.

Next, the pressure within the chamber was increased to 1 atm, and this pressure was maintained for 1 minute, and thereby, the sealing substrate 4 and the organic EL substrate 3 were pressed against each other. After that, the sealing substrate 4 and the organic EL element substrate 3, which had been pasted together with the above described first adhesive 14 and second adhesive 15, were irradiated with ultraviolet rays under predetermined conditions, and thereby, these first adhesive 14 and second adhesive 15 were cured. Subsequently, the pasted substrate was taken out from the chamber.

The application conditions of the second adhesive 15 for the lateral line portion 15*c* are the same as the application conditions of the adhesive 5 for the lateral line portion 5*c* according to Example 1, and the results of observing the sealing state of the organic EL panel 20 after pasting were the same as those in Example 1, which are shown in the above described Table 1.

The amount of application of the second adhesive 15 in the lateral line portion 15*c* under Application Conditions 1 to 4, increases in the order of 1, 2, 3 and 4. Under Application Conditions 1, 2 and 3, the second adhesive 15 did not spread throughout the entirety of the sealing substrate 4 and the organic EL element substrate 3 under the above described pressing conditions, and spaces remained in the four corners of this substrate. In contrast, under Application Condition 4, the second adhesive 15 had spread throughout the entirety of the sealing substrate 4 and the organic EL element substrate 3 under the above described pressing conditions.

When the organic EL panel 20 that had been fabricated under Application Condition 4 was observed using an optical microscope, no bubbles were found throughout the entirety of the organic EL panel 20.

In the above described example, the sealing substrate 4 to which the first adhesive 14 and the second adhesive 15 had been applied and the organic EL substrate were pasted together under reduced pressure, whereas the same results were obtained even when such pasting was carried out under atmospheric pressure.

As described above, an organic EL panel having no bubbles could be fabricated according to the present invention by appropriately adjusting the amount of the adhesive.

Furthermore, an organic EL display having no bubbles and excellent display quality could be fabricated using the organic EL panel that had been fabricated in accordance with the above described method.

EXAMPLE 3

Next, the viscosity of the first adhesive 14 and the viscosity of the second adhesive 15 are changed in the above described Example 2 and an example of an organic EL panel 20 that has been manufactured in accordance with the sealing method of the above described Embodiment 2 is shown in the following.

The present example is the same as Example 2 except for that the second adhesive 15 was applied so as to form the lateral line portion 15c under Condition 4 from among the four types of application conditions in Table 1 and several types of adhesives having different viscosities were used as the first adhesive 14 and the second adhesive 15.

The viscosities of the first adhesive 14 and the second adhesive 15 which were used in the present example, and the ratio of the viscosity of the first adhesive 14 to the viscosity of the second adhesive 15 are shown in Table 2.

TABLE 2

|  |  |  | First Adhesive 14 | | |
| --- | --- | --- | --- | --- | --- |
|  |  |  | 1-1 Viscosity 50 | 1-2 Viscosity 100 | 1-3 Viscosity 1000 |
| Second Adhesive 15 | 2-1 | Viscosity 0.5 | 100 | 220 | 2000 |
|  | 2-2 | Viscosity 2.2 | 23 | 50 | 455 |
|  | 2-3 | Viscosity 4.5 | 11 | 24 | 222 |

Unit of Viscosity is Pa·s

Here, an epoxy based ultraviolet ray curing resin (3112 made by Three Bond Co., Ltd.) into which a gap material made of $SiO_2$ having a particle diameter of 5 μm for the height adjustment and a filler (MP-15F made by Tatsumori Ltd.) made of $SiO_2$ having an average particle diameter of 1.5 μm are added, was used as the first adhesive 14 and the viscosity was adjusted by changing the added amount of the above described filler. Concretely, the added amount of the filler was increased in order to gain an adhesive having a high viscosity, while the added amount of the filler was reduced in order to gain an adhesive having a low viscosity.

In addition, 2-1, 2-2 and 2-3 of the second adhesive 15 shown in Table 2 are commercially available adhesives made of different materials, where 2-1 and 2-2 used acryl based ultraviolet ray curing resins (3042B and 3006 made by Three Bond Co., Ltd., respectively) and 2-3 used an epoxy based ultraviolet ray curing resin (3112 made by Three Bond Co., Ltd.) and thereby, different viscosities were provided.

Here, the viscosities of the first adhesive 14 and the second adhesive 15 at 25° C. were measured using a B type viscometer (BH made by Toki Sangyo Co., Ltd.), respectively.

The organic EL substrate 3 and the sealing substrate 4 were pasted together and pressed against each other in the same manner as in Example 2 via the first adhesive 14 and the second adhesive 15 which are respectively shown in Table 2.

Figure 18:
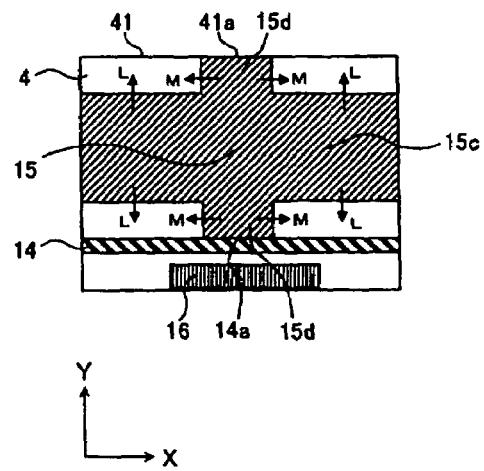
FIG. 18 is a schematic top plan diagram illustrating a method for sealing organic EL elements according to Example 3.

Next, the organic EL panel 20 gained by pasting the organic EL substrate 3 and the sealing substrate 4 together and pressing them against each other, was observed by means of an optical microscope. As a result, no bubbles were found throughout the entirety of the organic EL panel 20 in the case where the organic EL panel 20 had been fabricated under the condition where the ratio of the viscosity of the first adhesive 14 to the viscosity of the second adhesive 15 is 24, 50, 100, 220, 222, 455 or 2,000. In the case, when the organic EL substrate 3 and the sealing substrate 4 are pasted together and pressed against each other, as shown in FIG. 18, though the above described longitudinal line portion 15d of the second adhesive 15 makes contact with the center portion 14a of the first adhesive 14 in the longitudinal direction in the vicinity of the first adhesive 14 and pushes the first adhesive 14, the ratio of the viscosity of the first adhesive 14 to the viscosity of the second adhesive 15 is high, and therefore, the first adhesive 14 does not change its form and blocks the first adhesive 14 so as to prevent it from moving in the direction toward the terminal portion 16. Thus, the longitudinal line portion 15d of the second adhesive 15 spreads along the first adhesive 14 in the direction of arrows M in FIG. 18. In addition, the lateral line portion 15c of the second adhesive 15 spreads in the direction of arrows L. As a result, the second adhesive 15 spreads so as to push out spaces into the four corners. Accordingly, an organic EL panel 20 can be fabricated in such a manner that no bubbles are created throughout the entirety of the organic EL panel 20 in the case where the organic EL panel 20 has been fabricated in the condition where the ratio of the viscosity of the first adhesive 14 to the viscosity of the second adhesive 15 is 24, 50, 110, 220, 222, 455 or 2,000.

Figure 19:
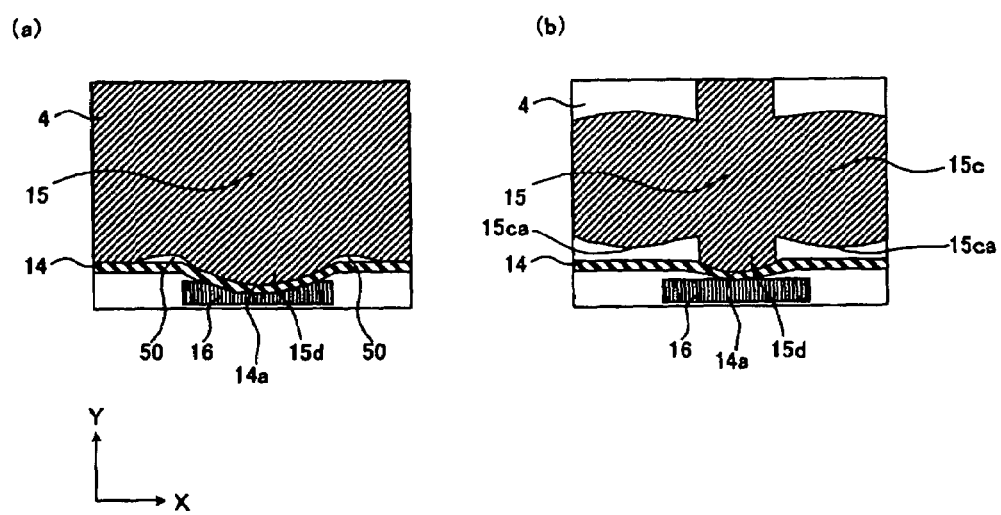
FIGS. 19(a) and 19(b) are schematic top plan diagrams illustrating a method for sealing organic EL elements according to Example 3.

Meanwhile, bubbles were found in the organic EL panel 20 that had been fabricated in the condition where the ratio of the viscosity of the first adhesive 14 to the viscosity of the second adhesive 15 was 11 or 23. FIG. 19(a) is a schematic top plan diagram showing the organic EL panel 20 that has been fabricated in the condition where the ratio of the viscosity of the first adhesive 14 to the viscosity of the second adhesive 15 is 11 or 23. As shown in FIG. 19(a), bubbles 50 are created in portions where the first adhesive 14 and the second adhesive 15 make contact with each other. In this case, the ratio of the viscosity of the first adhesive 14 to the viscosity of the second adhesive 15 is low when the organic EL substrate 3 and the sealing substrate 4 are pasted together and pressed against each other, and therefore, as shown in FIG. 19(b), the above described longitudinal line portion 15d of the second adhesive 15 makes contact with the center portion 14a of the first adhesive 14 in the longitudinal direction in the vicinity of the first adhesive 14 and pushes the first adhesive 14, and thereby, the first adhesive 14 changes its form so as to spread toward the terminal portion 16 side. In addition, the longitudinal line portion 15d of the second adhesive 15 is prevented by the first adhesive 14 which has changed its form from sufficiently spreading in the direction X along the first adhesive 14. In addition, though the edges of the lateral line portion 15c of the second adhesive 15 are straight lines in FIG. 18 for the purpose of convenience, they actually are undulating as shown in FIG. 19(b). It is assumed that the portions 15ca of the edges of the lateral line portion 15c of the second adhesive 15 which bulge toward the first adhesive 14 side make contact with the first adhesive 14 before the longitudinal line portion 15d of the second adhesive 15 sufficiently spreads in the direction X along the first adhesive 14, and thereby, bubbles 50 in FIG. 19(a) are formed.

That is to say, it was found that an organic EL panel 20, where no bubbles were created throughout the entirety of the organic EL panel 20 and the first adhesive 14 and the second adhesive 15 did not make contact with the terminal portion 16, could be fabricated in the condition where the ratio of the viscosity of the first adhesive 14 to the viscosity of the second adhesive 15 is not less than 24.

Though, in the above described example, the sealing substrate 4 to which the first adhesive 14 and the second adhesive 15 had been applied and the organic EL substrate 3 were pasted together under reduced pressure, the same results were obtained even when such pasting was carried out under atmospheric pressure.

As described above, an organic EL panel 20, where no bubbles were created throughout the entirety of the organic EL panel 20 and the first adhesive 14 and the second adhesive 15 did not make contact with the terminal portion 16, could be fabricated in the condition where the ratio of the viscosity of the first adhesive 14 to the viscosity of the second adhesive 15 is not less than 24.

As described above, an organic EL panel having no bubbles where a terminal portion could be electrically connected to an external terminal without any adhesive being attached could be fabricated according to the present invention by appropriately adjusting the amount of the adhesives and the ratio of the viscosity of the first adhesive to the viscosity of the second adhesive.

Furthermore, an organic EL display having no bubbles and excellent display quality could be fabricated using an organic EL panel that had been fabricated in accordance with the above described method.

The present invention was described by citing the embodiments in the above. It will be understood by those skilled in the art that these embodiments are illustrated making a variety of modifications possible through the combinations of the respective components of these embodiments and the respective processes, and such modifications are included in the scope of the present invention.

In addition, though in the embodiments the configuration of top emission where light emitted from the organic EL elements 2, 2 . . . is taken out from the sealing substrate 4 side is described, the technology according to the present invention can be applied to the configuration of bottom emission where light emitted from the organic EL elements are 2, 2 . . . is taken out from the organic EL element substrate 3 side. In the case where the technology according to the present invention is applied to the configuration of bottom emission, the same effects can be gained as those in the case of the above described embodiments.

The embodiments according to the third to seventh aspects of the present invention are described in the following in reference to the drawings.

Embodiment 3

First, the structure of an organic EL display panel that is fabricated in accordance with the manufacturing method according to the present embodiment is described below in reference to FIGS. 20 to 23(c).

1-1. Configuration of Entirety of Organic EL Display Panel

Figure 20:
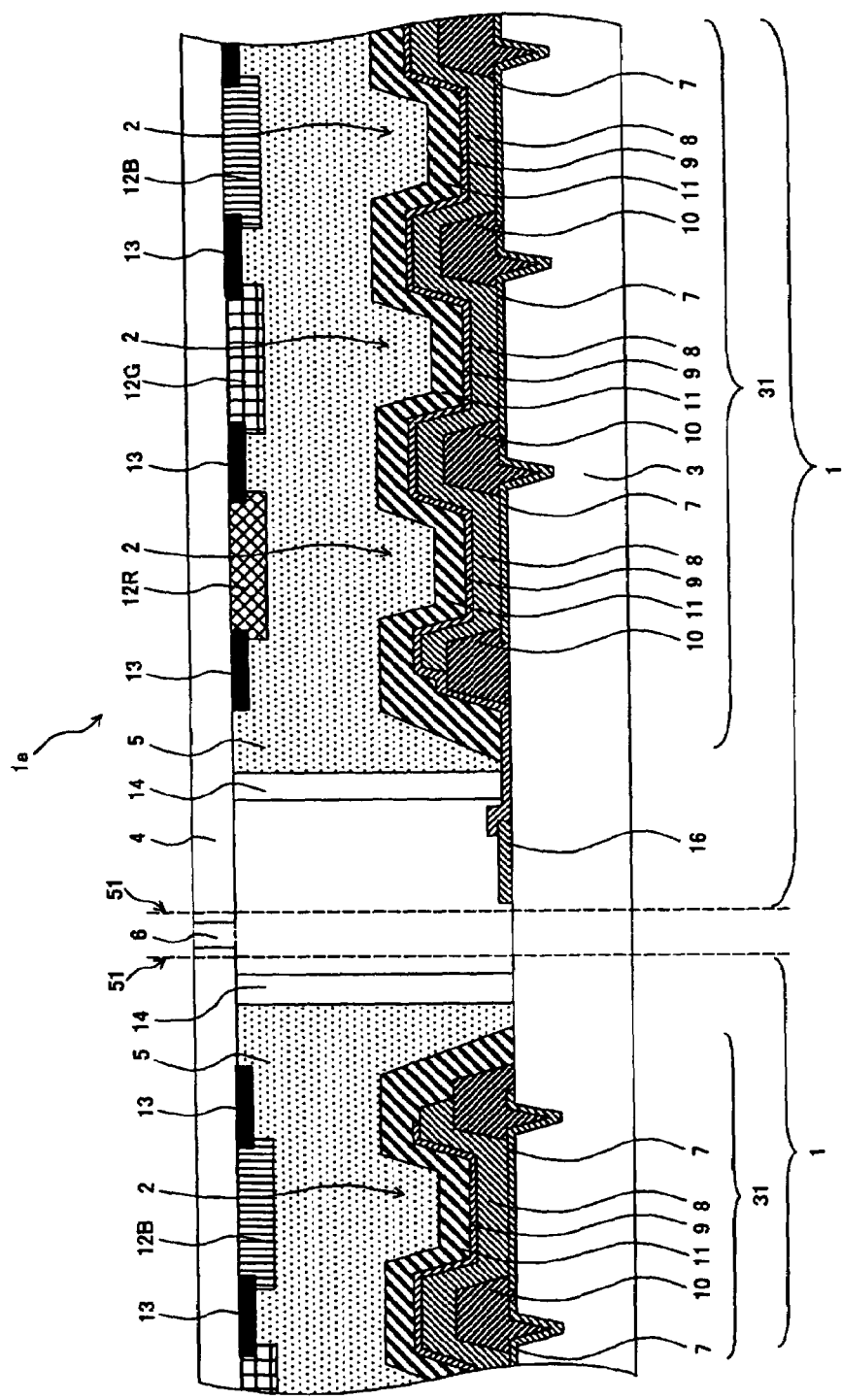
FIG. 20 is a schematic cross sectional diagram showing the configuration of an organic EL display panel according to Embodiment 3.
Figure 21:
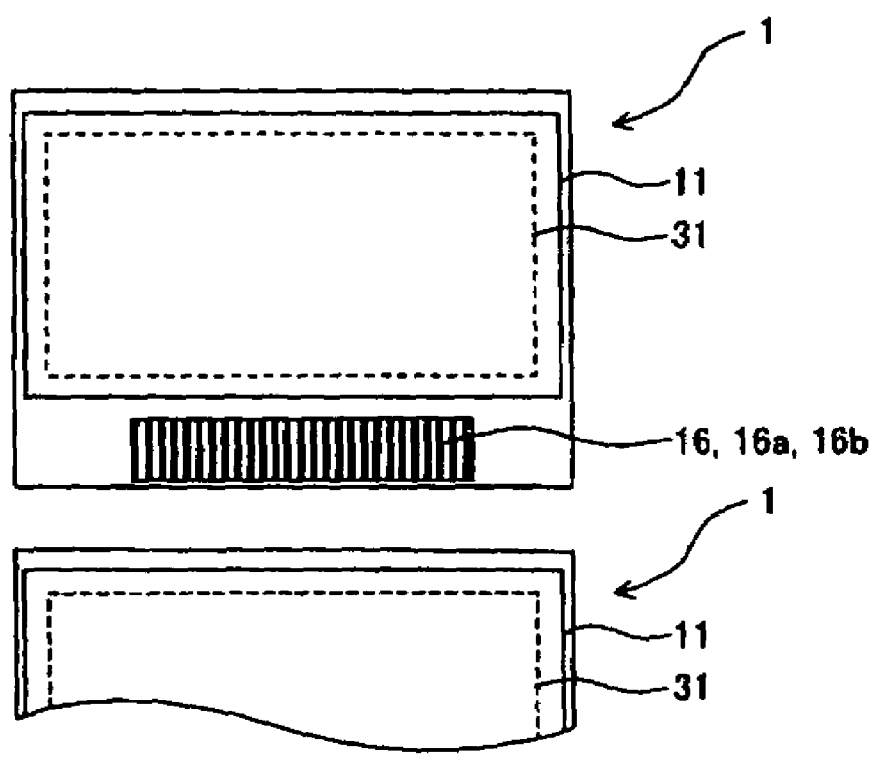
FIG. 21 is a schematic top plan diagram illustrating a manufacturing method for an organic EL display panel according to the present invention.

FIGS. 20 and 21 are a schematic cross sectional diagram and a top plan diagram illustrating the configuration of an organic EL display panel that has been fabricated in accordance with the manufacturing method according to the present embodiment.

FIG. 20 shows a state of a layered body 1a before being divided into organic EL display panels 1, and shows two organic EL display panels which are adjacent to each other with dividing portions 51 placed in between. After the fabrication of a sealed body 1a, the adjacent organic EL display panels 1 and 1 are divided along the dividing portions 51. The organic EL display panels 1 are formed of a mother substrate 3 and a mother sealing plate 4 for sealing with an organic EL display portion 31 being made to adhere between the mother substrate 3 and the mother sealing plate 4 for sealing via an adhesive layer 5.

The mother substrate 3 is formed of a TFT substrate on which driving TFT's are placed. In addition, a plurality of organic EL elements 2, 2 . . . are provided on the mother substrate 3 and the organic EL display portion 31 is formed of these organic EL elements 2, 2 . . . . In addition, a terminal portion 16 for electrically connecting an external circuit to the above described organic EL elements 2 so that an electrical signal can be sent to the organic EL elements 2 is provided in the vicinity of the organic EL display portion 31 on the mother substrate 3. A flexible plastic film, a metal film and the like in addition to glass can be used as the substrate where the above described TFT's are provided.

A partition 14 for blocking the adhesive layer 5 so as to prevent it from reaching the terminal portion 16 during the above described adhesion step is provided between the above described organic EL display portion 31 and the above described terminal portion 16. The form of this partition 14 is not limited as long as the adhesive layer 5 can be blocked from reaching the terminal portion 16. An adhesive of which the viscosity is higher than that of the adhesive layer 5, a patterned inorganic material film and a patterned organic material film can be used as this partition 14. In the case where an adhesive is used, a gap material for determining the thickness of the gap between the mother substrate 3 and the mother sealing plate 4 may be added. Inorganic materials, such as $SiO_X$ (silicon oxide), SiON (silicon oxide nitride) and SiN (silicon nitride), and metal materials such as Ag (silver), Ni (nickel) and Al (aluminum) can be used as this gap material.

The mother sealing plate 4 is formed of a transparent material having color filters 12R, 12G and 12B for red (R), green (G) and blue (B) on the surface that faces the organic EL elements 2. Furthermore, a black matrix 13 is provided between adjacent color filters. A flexible plastic film, a metal film and the like in addition to glass can be used as the mother sealing plate 4.

Thus, the number of organic EL elements 2, 2 . . . are formed so as to emit white light in the present embodiment, where white light that is emitted from the respective organic EL elements 2, 2 . . . is taken out to the outside via color filters 12R, 12G and 12B for R, G and B. As described above, the present embodiment provides a configuration of top emission where light emitted from the organic EL elements 2, 2 . . . is taken out from the mother sealing plate 4 side.

In addition, though the present embodiment provides a configuration where white light that has been emitted from a light emitting layer is taken out to the outside via color filters and thereby, light of three colors, red, green and blue is gained, a configuration for gaining light of three colors, red, green and blue may be provided by applying three types of light emitting layers, a red light emitting layer, a green light emitting layer and a blue light emitting layer for emitting red, green and blue light.

In addition, a hole 6 is provided to the mother sealing plate 4 in the region between the dividing portions 51 and 51 which are located between the adjacent organic EL display panels 1 and 1. This hole 6 is provided in order to release gas that exists in a space 22 that is surrounded by the mother substrate 3, the mother sealing plate 4, the adhesive layer 5 and the partition 14 are to the outside during the process for making the mother substrate 3 and the mother sealing plate 4 adhere to each other, and the form and the size of this hole 6 are not limited as long as the hole allows the air exist in the space 22 to be released to the outside.

As shown in FIG. 20, an anode 7, an organic layer 8 and a cathode 9 are layered in this order starting from the moth substrate 3 side, and thereby, the organic EL elements 2, 2 . . . is formed. The adjacent organic EL elements 2, 2 are separated by a cell isolation film 10 made of an insulating material that is placed between the adjacent organic EL elements 2, 2.

The anode 7 is formed of a metal compound, such as, for example, ITO (indium-tin oxide), and a light reflecting material made of a metal or an alloy, such as Ag (silver) may be placed beneath the metal compound. In addition, such anodes 7 are formed so as to be separated from each other for the respective organic EL elements 2, 2 . . . .

The organic layer 8 has a structure of (anode)/hole injection layer/light emitting layer/electron transferring layer/(cathode) and is formed, for example, in such a manner that the hole injection layer, the light emitting layer and the electron transferring layer are layered in this order starting from the anode 7 side. However, the structure of the organic layer is not limited to this, and known structures such as:

(1) (anode)/hole injection layer/light emitting layer/(cathode),
(2) (anode)/hole injection layer/light emitting layer/electron injection layer/(cathode),
(3) (anode)/hole injection layer/hole transferring layer/light emitting layer/electron injection layer/(cathode), and
(4) (anode)/hole injection layer/hole transferring layer/light emitting layer/electron transferring layer/electron injection layer/(cathode) are possible. In addition, the structures where the order of layering on the mother substrate 3 is opposite from the above, for example, a structure in the case where (cathode)/electron injection layer/electron transferring layer/light emitting layer/hole transferring layer/hole injection layer/(anode) are layered starting from the mother substrate 3 side are also possible.

The present embodiment provides a configuration where the light emitting layer has a two layered structure where a light emitting layer for emitting, for example, blue light and a light emitting layer for emitting orange light are layered so that white light can be emitted.

The cathode 9 is formed of a light transmitting material made of, for example, a metal compound, such as ITO, a metal or an alloy. According to the present embodiment, as shown in FIG. 20, the cathode 9 is continuous and formed so as to cover the respective organic EL elements 2, 2 . . . so as to work as a common cathode for the respective organic EL elements 2, 2 . . . . In addition, the cathode 9 is covered with a protective film 11.

The protective film 11 is formed on the mother substrate 3 so as to cover the organic EL display portion 31 and expose the above described dividing portion 51, terminal portion 16 and partition 14. Inorganic materials having low moisture transmission, such as silicon oxide and silicon nitride, can be used as the protective film 11.

Furthermore, in this diagram the adhesive layer 5 has fluidity and is made of a material which can be cured afterwards so as to seal the organic EL display portion. The adhesive layer is made of, for example, an ultraviolet ray curing resin, a visible light curing resin, a thermal setting resin, a complex curing resin which is cured by ultraviolet rays and heat, a post curing resin which is cured by ultraviolet rays and ultraviolet ray curing or thermal setting silicone rubber or silicone gel material in liquid. Here, in the case where a mother sealing plate 4 having color filters or CCM's (color converting layers) is used, ultraviolet rays can not transmit through the filter portions, and therefore, a thermal setting resin, a visible light curing resin, a post curing resin which is cured by ultraviolet rays, a silicone rubber material in liquid form or a silicone gel material in liquid form is used.

Concretely, as the sealing material 5, thermosetting resins, such as urea resins, melamine resins, phenol resins, resorcinol resins, epoxy resins, unsaturated polyester resins, polyurethane resins and acryl resins, thermoplastic resins, such as vinyl acetate resins, ethylene-vinyl acetate copolymer resins, acryl resins, cyano acrylate resins, polyvinyl alcohol resins, polyamide resins, polyolefin resins, thermoplastic polyurethane resins, saturated polyester resins and cellulose based resins, radical based light curing adhesives using resins, such as any acrylate from a variety of types, including ester acrylate, urethane acrylate, epoxy acrylate, melamine acrylate and acryl resin acrylate, as well as urethane polyester, cation based light curing adhesives using resins such as epoxy and vinyl ether, adhesives made of resins to which thiol/ene has been added, rubber based adhesives, such as chloroprene rubber based adhesives, nitride rubber based adhesives, styrene/butadiene rubber based adhesives, natural rubber based adhesives, butyl rubber based adhesives and silicone based adhesives, or complex synthetic polymer adhesives, such as vinyl-phenolic resins, chloroprene-phenolic resins, nitrile-phenolic resins, nylon-phenolic resins, epoxy-phenolic resins and nitrile-phenolic resins, are used.

The dividing portions 51 are placed between the adjacent organic EL display portions 31 and 31. In the present embodiment, as shown in FIG. 20, a dividing portion 51 is placed in a portion between a terminal portion 16 and an organic EL display portion 31 that is adjacent to this terminal portion 16.

FIG. 21 is a schematic top plan diagram showing the organic EL display panel 1 where the terminal portion 16 is placed in the proximity of the organic EL display portion 31. The terminal portion 16 is formed of anode lead portions 16a and cathode leading portions 16b which are connected to the anodes and cathodes of the organic EL elements, respectively. Here, though in FIG. 21, the terminal portion 16 is collectively placed along one side from among the four sides of the organic EL display portion 31 in the organic EL display panel 1, the arrangement of the terminal portion 16 is not limited to this and may be provided separately, for example, along the four sides of the organic EL display portion 31.

Though FIG. 20 shows, for the purpose of simplicity, the cathode 9 which is connected to the terminal portion 16, the cathode 9 is actually connected to a cathode lead portion 16b (not shown in FIG. 20) in the terminal portion 16 while the anode 7 of each organic element 2 is connected to an anode lead portion 16a (not shown in FIG. 20) in the terminal portion 16.

As shown in FIGS. 20 and 21, the terminal portion 16 is placed on the outside of the organic EL display portion 31 in the proximity of this display portion 31, and an electrical signal is supplied from the outside to the organic EL display portion 31 via this terminal portion 16.

1-2. Concerning the Characteristics of the Present Embodiment

The method for fabricating an organic EL display panel 1 as that shown in FIG. 20 using the manufacturing method according to the present embodiment, is described in the following in reference to FIGS. 22 to 23 (*c*)

Here, a case where four organic EL display panels are manufactured is described. Organic EL display panels can be manufactured in the same manner as this even in the case where a number, other than four, of organic EL display panels are manufactured. For the purpose of convenience, FIGS. 22 to 23(*c*) illustrate dividing portions 51 in a state where organic EL display panels have been manufactured using the manufacturing method according to the present embodiment.

First, a hole 6 for releasing gas between the mother sealing plate 4 and the mother substrate 3 during the below described step of fabricating a layered body is opened in the mother sealing plate 4 and the mother substrate 3. A case where a hole 6 as described above is opened in the mother sealing plate 4 is described in the present embodiment. FIG. 22(*a*) is a schematic top plan diagram showing the mother sealing plate 4 where the above described hole 6 has been opened. The hole 6 can be formed in accordance with an end mill method, a sand blast method, a wet etching method, a dry etching method or a laser beam radiation method. This hole 6 is provided in order to release gas that exists in a space 22 that is surrounded by the mother substrate 3, the mother sealing plate 4, the adhesive layer 5 and the partition 14 to the outside during a layered body fabricating step of fabricating a layered body 1*a* by pasting the mother substrate 3 and the mother sealing plate 4 together. A hole having a form and a size which can release gas that exists in the space 22 to the outside can be utilized as this hole 6.

Figure 22:
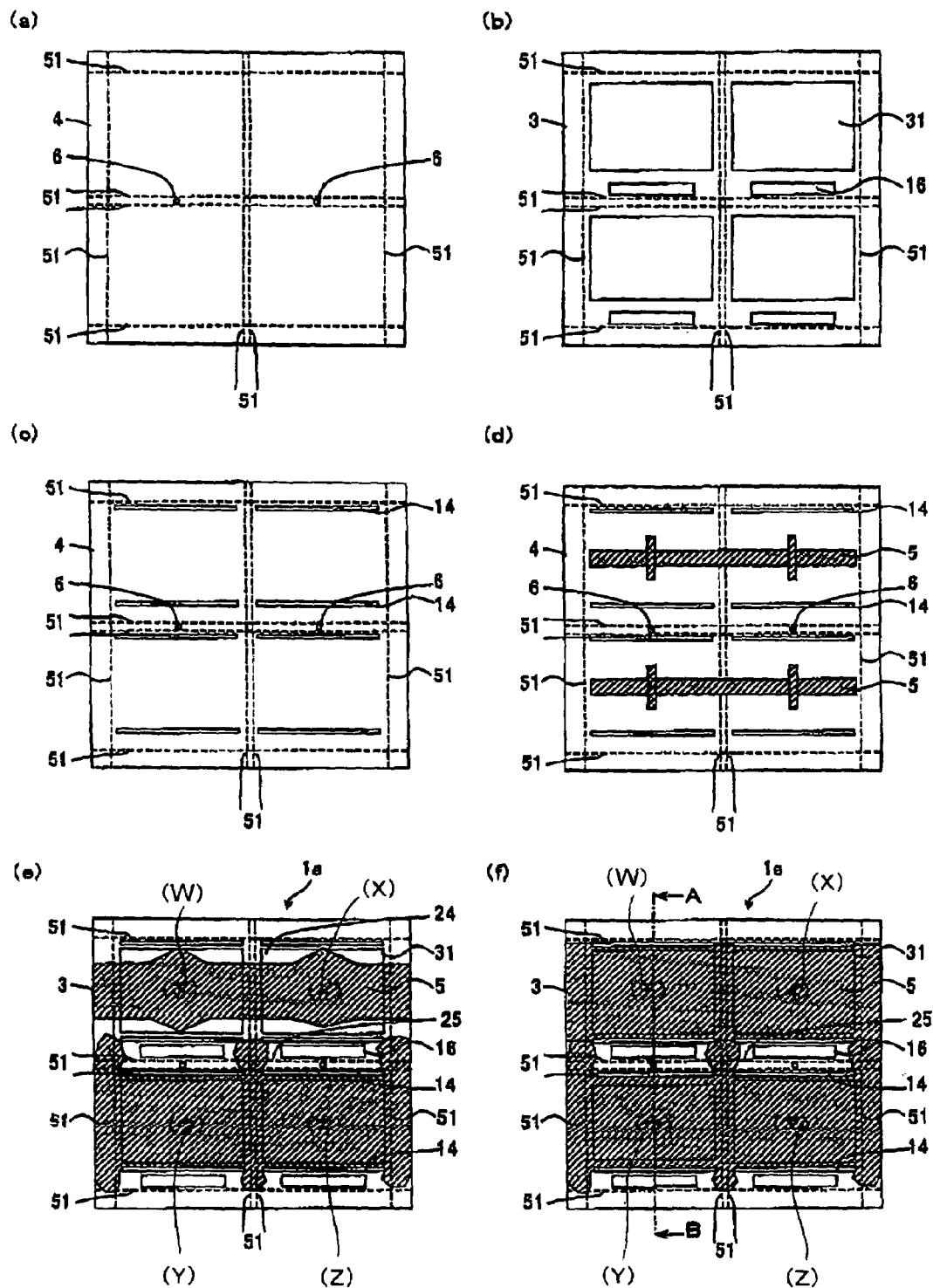
FIG. 22 is a schematic top plan diagram illustrating a manufacturing method for an organic EL display panel according to Embodiment 3.
Figure 23:
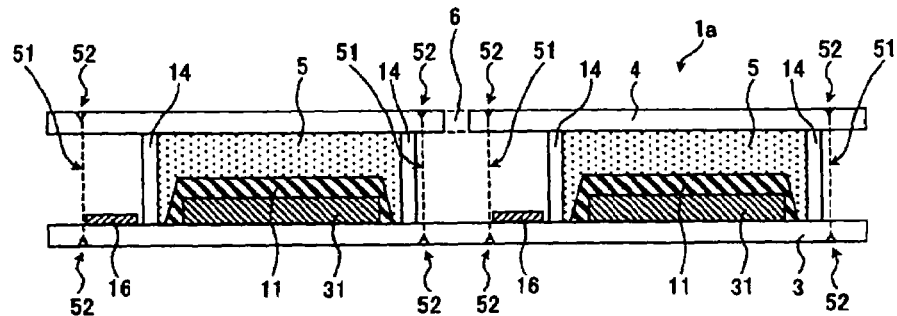
FIGS. 23(a) to 23(c) are schematic cross sectional diagrams illustrating a manufacturing method for an organic EL display panel according to Embodiment 3.
Figure 23:
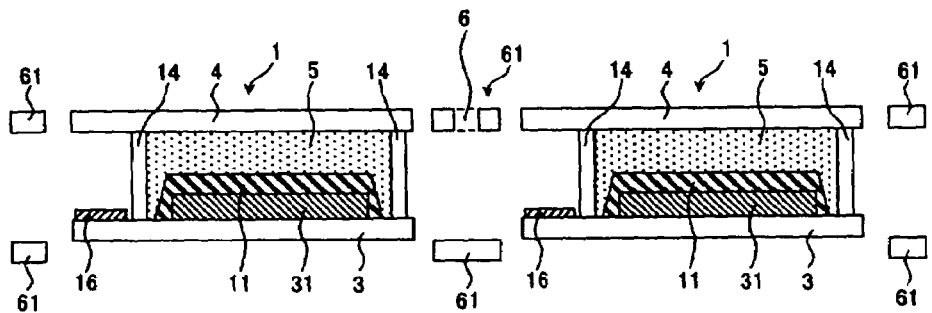
Figure 23:
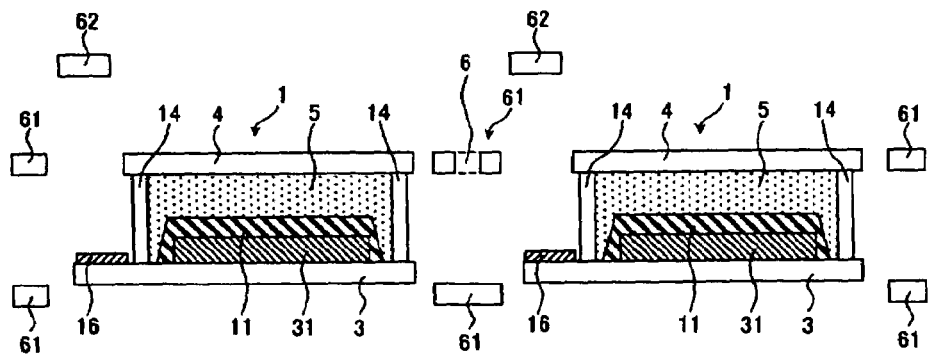

In reference to FIG. 22(*a*), a hole 6 is provided to the layered body 1*a* in a region between dividing portions 51, 51 through which every two organic EL display portions 31 that are adjacent to each other with a terminal portion 16 placed in between, can be divided into organic EL display panels each of which has an organic EL display portion 31. The hole 6 can be provided to the mother sealing plate 4 in a region other than the organic EL display panel regions and in a region to which an adhesive is not applied in the below described adhesive applying step. Here, the hole can also be provided in a portion that is separated from an organic EL display panel 1 in the below described separation step, for example, in a place of the mother sealing plate 4 that is located above the terminal portion 16. In addition, it is preferable for the hole 6 to be provided in a region where the adhesive layer 5 does not exist between the mother substrate 3 and the mother sealing plate 4 in a state where the layered body 1*a* has been formed by making the mother substrate 3 on which the organic EL display portions 31 have been formed adhere to the mother sealing plate 4 via the adhesive layer 5.

In addition, the organic EL display portion 31 that is formed of the organic EL elements 2 and the terminal portion 16 are formed on the surface of the mother substrate 3. FIG. 22(*b*) is a schematic top plan diagram showing a case where the organic EL display portion 31 that is formed of the organic EL elements 2 is formed on the mother substrate 3. Here, the organic EL elements 2 have a structure as that described above. At this time, each organic EL elements 2 is formed so that an anode 7 and a cathode 9 of the organic EL element 2 are electrically connected to the above described terminal portion 16. Furthermore, a protective film 11 is formed so as to cover the organic EL elements 2, 2 . . . (not shown).

Next, a partition 14 is formed on the surface of the mother sealing plate 4, on the side where the organic EL display portion 31 is sealed, or on the surface of the mother substrate 3, on the side where the organic EL display portion 31 is formed. According to the present embodiment, the partition 14 is formed by applying an adhesive having a high viscosity to the surface of the mother sealing plate 4, on the side to which the above described mother substrate 3 is pasted. FIG. 22(*c*) is a schematic top plan diagram showing a case where an adhesive having a high viscosity is applied in linear form to the surface of the mother sealing plate 4 in a location which corresponds to the location between the above described organic EL display portion 31 and the terminal portion 16 that is electrically connected to the organic EL elements 2 that form the organic EL display portion, and in the vicinity of the dividing portion 51 on the side opposite to the terminal portion 16 with the above described location in between. This partition 14 is formed in the location which corresponds to the location between the above described organic EL display portion 31 and the terminal portion 16, and has a form, a size and a height that allow the adhesive layer 5 to be blocked so as to be prevented from reaching the terminal portion 15. In the case where an adhesive is used for the partition 14, a gap material for setting a gap between the mother substrate 3 and the mother sealing plate 4 may be added to the adhesive. As this gap material, inorganic materials, such as $SiO_X$ (silicon oxide), SiON (silicon oxide nitride) and SiN (silicon nitride), or metal materials, such as Ag (silver), Ni (nickel) and Al (aluminum) can be used.

As for the method for forming the partition 14, a method where a resist is formed in a pattern may be used, in addition to a method for applying an adhesive having a high viscosity to the above described determined location on the mother sealing plate 4. In addition, in the case where color filters are formed on the surface of the mother sealing plate 4, as described above, an over-coating layer may be provided on the mother sealing plate 4 in order to flatten the surface, or the partition 14 may be formed of a protrusion that is provided in a predetermined location on this over-coating layer. In addition, a film may be formed of an inorganic material or an organic material, between the organic EL display portion 31 and the terminal portion 16 that is electrically connected to the organic EL elements 2 which form the organic EL display portion 31 on the mother substrate 3.

Subsequently, the adhesive layer 5 is applied to the surface of the mother sealing plate 4, on the side to which the above described mother substrate 3 is pasted, or to the surface of the mother substrate 3, on the side to which the above described mother sealing plate 4 is pasted. According to the present embodiment, a case where the adhesive layer 5 is applied to the former surface is described. FIG. 22(*d*) is a schematic top plan diagram showing a case where the adhesive layer 5 is applied to the surface of the mother sealing plate 4 in the form of a band which penetrates through the adjacent organic EL display portions 31 and 31 in a region that includes a region corresponding to the above described organic EL display portion 31 and excludes the terminal portion 16, the partition 14 and the above described hole 6, and in the form of a line crossing the above described band form in a region corresponding to each organic EL display portion 31. Though according to the present embodiment, the adhesive layer 5 is applied in a form as that shown in FIG. 22(*d*), the form of the adhesive layer 5 is not limited to this, and may be a form for allowing the mother substrate 3 and the mother sealing plate 4 to be pasted together via the adhesive layer 5, which covers the organic EL display portion 31 without being attached to the terminal portion 16.

Next, the above described mother substrate 3 and mother sealing plate 4, where the above described adhesive layer 5 has been applied and the partition 14 has been formed are pasted together, and the mother substrate 3 and the mother sealing plate 4 are pressed against each other, and thereby, the adhesive layer 5 is spread between the two substrates. FIG. 22(e) is a schematic top plan diagram showing a state where the adhesive layer 5 is spread between the two substrates by pasting the mother substrate 3 and the mother sealing plate 4 together and pressing the mother substrate 3 and the mother sealing plate 4 against each other. Here, even when the adhesive layer 5 spreads, the partition 14 prevents the adhesive layer 5 from reaching the terminal portion 16. According to the present embodiment, the partition 14 is made of an adhesive which is an adhesive having a high viscosity and barely spreads, and thus, does not reach the terminal portion 16, and in addition, prevents the adhesive layer 5 from reaching the terminal portion 16.

In the step of spreading the adhesive layer 5 as described above, as shown in FIG. 22(e), the adhesive layer 5 that has been applied to a region which corresponds to the organic EL display portion (W) and the organic EL display portion (X) does not spread so as to completely cover these display portions. In FIG. 22(e), a region 24 is a region of an organic EL display portion which is not covered with the adhesive layer 5.

In contrast, the adhesive layer 5 that has been applied to a region which corresponds to the organic EL display portion (Y) and the organic EL display portion (Z) spreads so as to completely cover these display portions, and an extra amount of the adhesive layer 5 spreads around the two ends of the partition 14 in the vicinity of these display portions. The portions of the adhesive layer 5 which spread toward the organic EL display portion (W) side and the organic EL display portion (X) side from among the portions of the adhesive layer 5 which spread around the two ends of the partition 14 as described above make contact with partitions 14 and 14 between each of the organic EL display portion (W) and the organic EL display portion (X), and the terminal portion 16 which is electrically connected to it, so as to form spaces 25 and 25.

It is assumed that the applied amount of the adhesive layer 5 that has been applied to a region which corresponds to the organic EL display portion (Y) and the organic EL display portion (Z) is greater than the applied amount of the adhesive layer 5 that has been applied to a region which corresponds to the organic EL display portion (W) and the organic EL display portion (X), and therefore, the extra portion of the adhesive layer 5 that spreads from the region which corresponds to the organic EL display portion (Y) and the organic EL display portion (Z), where the applied amount is great, makes contact with the partitions 14 and 14 between each of the organic EL display portion (W) and the organic EL display portion (X), which are adjacent to the organic EL display portion (Y) and the organic EL display portion (Z), respectively, and the terminal portion 16 which is electrically connected to it, and thus, forms spaces 25 and 25. That is to say, it is assumed that the above described spaces 25 are formed due, as described below, to unevenness in the applied amount of the adhesive 5 that has been applied to the mother sealing plate 4 or warps in the flatness of the mother sealing plate 3.

In the following, the cause of the formation of the above described spaces 25 is additionally described.

In some cases, the amount of the adhesive layer 5 that is applied to the mother sealing plate 4 may be dispersed for each of the corresponding organic EL display portions 31. This is caused by unevenness in the amount of discharge or the rate of scanning of the discharging portion, or warps, such as bending or undulation, in the mother sealing plate 4 when the adhesive layer 5 is applied using, for example, a dispenser. In addition, even in the case where there is no dispersion in the applied amount, there may be unevenness in the manner of spreading of the adhesive layer 5, due to unevenness in the pressure for pressing the mother substrate 3 and the mother sealing plate 4 against each other. Such problems become more significant as the number of organic EL display panels that are taken out from the layered body made of a pair of the mother substrate 3 and the mother sealing plate 4 increases.

In the present embodiment, however, when the hole 6 is formed and the mother substrate 3 and the mother sealing plate 4 are further pressed against each other from the state shown in FIG. 22(e), gas within the space 25 can be pushed out to the outside through the hole 6 so as to be released, because the above described space 25 is an open space which is connected to the outside via the above described hole 6. Accordingly, the gap between the mother substrate 3 and the mother sealing plate 4 can be narrowed, and the gas that exists in the above described space 25 can be pushed out to the outside through the hole 6 so as to be released, and therefore, the adhesive layer 5 can be uniformly spread on each of the display portions.

FIG. 22(f) is a schematic top plan diagram showing a state where the adhesive layer 5 is further spread between the two substrates by further pressing the mother substrate 3 and the mother sealing plate 4 against each other from the state shown in FIG. 22(e).

The adhesive layer 5 on the organic EL display portion (W) and the organic EL display portion (X) spreads uniformly so as to completely cover the respective display portions.

In the present embodiment, gas that exists in the above described space 25 can be pushed out to the outside through the hole 6 so as to be released, and therefore, the region 24 of the organic EL display portion that is not covered with the adhesive layer 5 in FIG. 22(e) is also covered with the adhesive layer 5, and thereby, the adhesive layer 5 can be uniformly spread, so that the entirety of the organic EL display portion 31 is completely covered with the adhesive layer 5. In addition, gas that exists in the above described space 25 can be pushed out to the outside through the hole 6 so as to be released, and therefore, the gap between the mother substrate 3 and the mother sealing plate 4 can further be narrowed, and the gap between the mother substrate 3 and the mother sealing plate 4 can be set so as to be the same as the diameter of the gap material that has been added to the partition 14 in order to maintain a predetermined gap.

In addition, in the case of this embodiment, the adhesive layer 5 does not spread to the location of the above described hole 6, and therefore, the adhesion apparatus is not contaminated by the adhesive leaking out through this hole 6.

In the above described step of spreading the adhesive layer 5 and the step of releasing the gas which exists in the space 22 to the outside through the hole 6, the mother substrate 3 and the mother sealing plate 4 are pasted together in air, and the mother substrate 3 and the mother sealing plate 4 are pressed against each other through the application of external force as in the present embodiment, and thereby, spreading of the adhesive layer 5 and releasing of the gas that exists in the space 22 to the outside through the hole 6 can be carried out simultaneously.

In addition, the gas inside the space 22 is slowly released through the hole 6 using a vacuum pump, and thereby, the adhesive layer 5 can be pressed and spread due to a difference in the pressure between the internal pressure and the external pressure.

Furthermore, the adhesive layer 5 is cured under predetermined conditions, and thereby, the layered body 1a is formed. Here, in the present embodiment, the partition 14 made of an adhesive having a high viscosity is also cured under predetermined conditions.

Next, the above described sealed body 1a is divided along dividing portions 51 between adjacent organic EL display portions 31 and 31, and thereby, organic EL display panels 1 and 1 are gained. FIGS. 23(a) to 23(c) are schematic cross sectional diagrams illustrating the manner in which the sealed body 1a is divided along dividing portions 51. Here, FIGS. 23(a) to 23(c) are schematic cross sectional diagrams showing the case where cutting is carried out between AB in FIG. 22(f). Here, though FIGS. 23(a) to 23(c) illustrate, for the purpose of convenience, the organic EL display portions 31 and the terminal portions 16 as not being connected to each other, these are actually electrically connected to each other.

In reference to FIGS. 23(a) to 23(c), the organic EL display panels 1 are formed in such a manner that an organic EL display portion 31 on the mother substrate 3 is sealed to the mother sealing plate 4 through the protective layer 11 and the adhesive layer 5. In FIGS. 23(a) to 23(c), two pairs of an organic EL display portion 31 and a terminal portion 16 are formed between the mother substrate 3 and the mother sealing plate 4. Furthermore, a partition 14 exists between each pair of an organic EL display portion 31 and a terminal portion 16, and prevents the adhesive layer 5 from reaching the terminal portion 16. In addition, in the present embodiment, the partition 14 exists between the organic EL display portion 31 and the dividing portion 51 on the side opposite to the terminal portion 16, and prevents the adhesive layer 5 from reaching the above described dividing portion.

A hole 6 is formed in the mother sealing plate 4, in a region that corresponds to a location between dividing portions 51 and 51, which are located between adjacent organic EL display portions 31 and 31.

As shown in FIG. 23(a), dividing trenches 52 are formed in the surfaces of the mother substrate 3 and the mother sealing plate 4 of the layered body 1a, so as to correspond to dividing portions 51. Next, appropriate stress is applied to the layered body 1a, and thereby, as shown in FIG. 23(b), the layered body 1a is divided into organic EL display panels 1 and unnecessary portions 61, and thus, the organic EL display panels 1 can be taken out (two organic EL display panels, in the case of FIG. 23(b)).

Here, as shown in FIG. 23(b), the above described hole 6 exists in an unnecessary portion 61, and therefore, organic EL display panels 1 that do not have holes 6 can be fabricated. Here, the locations of the dividing portions 51 and the dividing trenches 52 are adjusted, and thereby, division may be carried out in such a manner that the organic EL display panels 1 have the above described holes 6, or division may be carried out through the location of the holes 6.

Next, stress is applied to an organic EL display panel 1, and thereby, the portion of the mother sealing plate 4 that is located above the terminal portion 16 is separated form the organic EL display panel 1. The adhesive layer 5 does not exist above the terminal portion 16, and therefore, when stress is applied to the organic EL display panel 1, the unnecessary portion 62 that is made of a portion of the mother sealing plate 4 that is located above the terminal portion 16 can be separated from the mother substrate 3 of the organic EL display panel 1 (FIG. 23(c)). The organic EL display panel is completed in the above described manner. Here, as described above, even in the case where holes 6 are provided in the unnecessary portions 62, organic EL panels 1 that do not have holes 6 can be fabricated.

As described above, according to the present invention, a predetermined amount or more of an adhesive layer is applied so that there is no shortage of the applied amount, and thereby, even in the case where the applied amount of the adhesive layer 5 that is applied to the mother sealing plate 4 is uneven, there is a warp in the flatness of the mother sealing plate 3, or portions of the adhesive layer that have spread from portions with a large applied amount make contact with each other in the layered body fabricating step of fabricating a layered body by pasting the mother substrate and the mother sealing plate together, or the adhesive layer that has spread from a portion with a large applied amount makes contact with the partition, a desired distance can be maintained between the mother substrate and the mother sealing plate after the two have been finally sealed, without forming a closed space that is surrounded by the mother substrate, the mother sealing plate and the adhesive layer, or by the mother substrate, the mother sealing plate, the adhesive layer and the partition, and the adhesive layer can be uniformly spread, without creating closed spaces in the organic EL display portion, and thereby, an organic EL display panel having high display quality, excellent light emitting properties and high reliability can be manufactured.

Embodiment 4

First, the structure of an organic EL display panel that has been fabricated in accordance with the manufacturing method according to the present embodiment is described in reference to FIGS. 24(a) to 25(d).

2-1. Configuration of Entirety of Organic EL Display Panel

The structure of an organic EL display panel that has been fabricated in accordance with the manufacturing method according to the present embodiment is the same as that in the case of Embodiment 3, except that the partition 14 does not exist. In the present embodiment, portions of the adhesive layer 5, at least on the terminal portion 16, are not cured after the application of the adhesive layer 5, and the layered body 1a is divided along the dividing portions 51, and after that, the portions of the adhesive layer 5 that have not been cured are washed and removed, and thereby, the terminal portion 16 is exposed.

2-2. Concerning the Characteristics of the Present Embodiment

A method for fabricating an organic EL display panel 1 in accordance with the manufacturing method according to the present embodiment is described in the following, in reference to FIGS. 24(a) to 25(d). Here, a case where four organic EL display panels are manufactured is described. Here, the method for fabrication is the same in the case where a number, other than four, of organic EL display panels are manufactured. For the purpose of convenience, FIGS. 24(a) to 25(d) illustrate dividing portions 51 in a state where organic EL display panels have been manufactured in accordance with the manufacturing method according to the present embodiment.

First, a hole 6 for releasing gas between the mother sealing plate 4 and the mother substrate 3 during the below described step of fabricating a layered body is opened in the mother sealing plate 4 and the mother substrate 3. A case where a hole 6 as described above is opened in the mother sealing plate 4 is described in the present embodiment. FIG. 24(a) is a schematic top plan diagram showing the mother sealing plate 4 where the above described hole 6 has been opened. The hole 6 can be formed in accordance with an end mill method, a sand blast method, a wet etching method, a dry etching method, a laser beam radiation method or the like. This hole 6 is provided in order to release gas that exists in a space 22 that is surrounded by the mother substrate 3, the mother sealing plate 4 and the adhesive layer 5 to the outside during a layered body fabricating step of fabricating a layered body by pasting the mother substrate and the mother sealing plate together. A hole having a form and a size which can release gas that exists in the space 22 to the outside can be utilized as this hole 6.

In reference to FIG. 24(a), a hole 6 is provided to the layered body 1a in a region between dividing portions 51, 51 through which every four organic EL display portions 31 that are adjacent to each other, can be divided into organic EL display panels each of which has an organic EL display portion 31. The hole 6 can be provided to the mother sealing plate 4 in a region other than the organic EL display panel regions and in a region to which an adhesive is not applied in the below described adhesive applying step. In addition, it is preferable for the hole 6 to be provided in a region where the adhesive layer 5 does not exist between the mother substrate 3 and the mother sealing plate 4 in a state where the layered body 1a has been formed by making the mother substrate 3 on which the organic EL display portions have been formed adhere to the mother sealing plate 4 via the adhesive layer 5.

In addition, the organic EL display portion 31 that is formed of the organic EL elements 2 and the terminal portion 16 are formed on the surface of the mother substrate 3. FIG. 24(b) is a schematic top plan diagram showing a case where the organic EL display portion 31 that is formed of the organic EL elements 2 is formed on the mother substrate 3. Here, the organic EL elements 2 have a structure as that described above. At this time, each of the organic EL elements 2 is formed so that an anode 7 and a cathode 9 of the organic EL element 2 are electrically connected to the above described terminal portion 16. Furthermore, a protective film 11 is formed so as to cover the organic EL elements 2, 2 . . . (not shown).

Subsequently, an adhesive layer 5 is applied to the surface of the mother sealing plate 4, on the side to which the above described mother substrate 3 is pasted. FIG. 24(c) is a schematic top plan diagram showing a case where an adhesive layer 5 has been dropped onto each of the above described organic EL display portions 31, 31 . . . on the surface of the mother sealing plate 4. Though in the present embodiment, the adhesive layer 5 has been dropped in circular form in the vicinity of the center of each organic EL display portion 31, 31 . . . , as shown in FIG. 24(c), the form of the adhesive layer 5 is not limited to this, and may be in such a form that the mother substrate 3 and the mother sealing plate 4 can be pasted together via the adhesive layer 5, which covers each of the organic EL display portions 31, 31 . . . .

Next, the above described mother substrate 3 and mother sealing plate 4 to which the above described adhesive layer 5 has been applied so as to form a partition 14 are pasted together, and the adhesive layer 5 is spread between the two substrates by pressing the mother substrate 3 and the mother sealing plate 4 against each other. FIG. 24(d) is a schematic top plan diagram showing a state where the adhesive layer 5 has been spread between the two substrates by pasting the mother substrate 3 and the mother sealing plate 4 together and pressing the mother substrate 3 and the mother sealing plate 4 against each other. As shown in FIG. 24(d), the adhesive layer 5 that has been dropped onto the four adjacent organic EL display portions 31 spreads into concentric circular shapes, and respective pieces of the adhesive layer 5 make contact with each other, so as to surround the hole 6, and thus, a space 22 is formed. In the case of the present embodiment, the space 22 is formed, regardless of whether or not the applied amount of the adhesive layer 5 is uneven, or even when the applied amount is great. This space 22 is an open space that is connected to the outside via the above described hole 6. In this state, regions 32 which are portions of the organic EL display portions 31 are not covered with the adhesive layer 5. Furthermore, the mother substrate 3 and the mother sealing plate 4 are pressed against each other, so that the adhesive layer 5 is further spread between the two substrates. In addition, gas that exists in the above described space 22 is released to the outside through the above described hole 6. FIG. 24(e) is a schematic top plan diagram showing a state where the adhesive layer 5 has further been spread between the two substrates by further pressing the mother substrate 3 and the mother sealing plate 4 against each other from the state shown in FIG. 24(d). In the present embodiment, the gas that exists in the space 22 can be released to the outside through the hole 5 that is connected to the above described space 22 by applying pressure, as described above. As a result of this, the space 22 can further be narrowed, and the gap between the mother substrate 3 and the mother sealing plate 4 can be narrowed. In addition, the adhesive layer 5 can be uniformly spread, so as to completely cover the entirety of the organic EL display portions 31.

As described above, the gas is released through the hole 6, and therefore, no closed spaces are created in the organic EL display portions 31, and the regions 32 on the organic EL display portions 31 which have not been covered with the adhesive layer 5 in the state of FIG. 24(d) can also be covered with the adhesive layer 5, and thus, the adhesive layer 5 can completely cover the organic EL display portions 31. In addition, the adhesive layer 5 does not spread to the location of the above described hole 6, and therefore, the adhesion apparatus is not contaminated by adhesive leaking out from this hole 6.

Furthermore, the adhesive layer 5 is cured under predetermined conditions, and thereby, the layered body 1a is formed. Here, in the present embodiment, the portions of the adhesive layer 5 that exists on the above described terminal portions 16 are not cured. In accordance with a method for curing such a pattern, in the case where, for example, the adhesive layer 5 is made of an ultraviolet ray curing resin, the portions of the adhesive layer 5 that exists on the terminal portions 16 are blocked with a mask while other regions are irradiated with ultraviolet rays, and thereby, the ultraviolet ray curing resin in the regions other than those on the terminal portions 16 can be cured.

Next, the above described sealed body 1a is divided along dividing portions 51 between adjacent organic EL display portions 31 and 31, and thereby, organic EL display panels 1 and 1 are gained. FIGS. 25(a) to 25(d) are schematic cross sectional diagrams illustrating the manner in which the sealed body 1a is divided along dividing portions 51. Here, FIGS. 25(a) to 25(d) are schematic cross sectional diagrams showing the case where cutting is carried out between CD of FIG. 24(e). Here, though for the purpose of convenience, FIGS. 25(a) to 25(d) illustrate the organic EL display portions 31 and the terminal portions 16 as not being connected to each other, the two are actually electrically connected to each other.

In reference to FIGS. 25(a) to 25(d), the organic EL display panels 1 are formed in such a manner that an organic EL display portions 31 and a protective layer 11 on the mother substrate 3 are sealed to the mother sealing plate 4 via the adhesive layer 5. In FIGS. 23(a) to 23(c), two pairs of an organic EL display portion 31 and a terminal portion 16 are formed between the mother substrate 3 and the mother sealing plate 4. Uncured adhesive layer 15 exists on the terminal portions 16, and the adhesive layer 5 in other regions is cured.

As shown in FIG. 25(a), dividing trenches 52 are formed in the surface of the mother substrate 3 and the mother sealing plate 4, which correspond to dividing portions 51 of the layered body 1a. Next, appropriate stress is applied to the layered body 1a, and thereby, as shown in FIG. 25(b), the layered body 1a is divided into organic EL display panels 1 and unnecessary portions 61, and thereby, organic EL display panels 1 are taken out (two organic EL display panels, in the case of FIG. 25(b)).

Next, stress is applied to an organic EL display panel 1, and thereby, the portion of the mother sealing plate 4 which is located above the terminal portion 16 is separated from the organic EL display panel 1. The portion of the adhesive layer 15 above the terminal portion 16 is uncured, and therefore, when stress is applied to the organic EL display panel 1, the mother substrate 3 side and the mother sealing plate 4 side are easily separated from each other due to the uncured adhesive layer 5 above the terminal portion 16, and at the same time, an unnecessary portion 62, located above the terminal portion 16, of the organic EL display panel 1 made of the mother sealing plate 4 and the sealing material 5 can be separated from the mother substrate 3 (FIG. 25(c)). Furthermore, the uncured adhesive layer 15 that adheres to the terminal portion 16 is washed and removed (FIG. 25(d)), and thus, the organic EL display panel 1 is completed.

As described above, according to the present invention, the gap between the mother substrate and the mother sealing plate can be set to a desired height after the two have been finally sealed, without forming a closed space surrounded by the mother substrate, the mother sealing plate and the adhesive layer in the layered body fabricating step of fabricating a layered body by pasting the mother substrate and the mother sealing plate together, and the adhesive layer can be uniformly spread on the organic EL display portion, and thus, an organic EL display panel having high display quality, excellent light emitting properties and high reliability can be manufactured.

Embodiment 5

First, the structure of an organic EL display panel that has been fabricated in accordance with the manufacturing method according to the present embodiment is described in reference to FIGS. 26(a) to 27(d).

3-1. Configuration of Entirety of Organic EL Display Panel

The structure of an organic EL display panel that has been fabricated in accordance with the manufacturing method according to the present embodiment is the same as that in the case of Embodiment 3, except that no partition 14 exists. In the present embodiment, the terminal portion 16 is masked before the application of the adhesive layer 5, and thereby, the adhesive layer 5 is prevented from reaching the terminal portion 16. After that, the adhesive layer 5 is cured, and the mask is removed after division, and thereby, the terminal portion 16 is exposed.

3-2. Concerning the Characteristics of the Present Embodiment

A method for fabricating an organic EL display panel 1 in accordance with the manufacturing method according to the present embodiment is described in the following, in reference to FIGS. 26(a) to 27(d). Here, a case where four organic EL display panels are manufactured is described. Here, the method for fabrication is the same in the case where a number, other than four, of organic EL display panels are manufactured. For the purpose of convenience, FIGS. 26(a) to 27(d) illustrate dividing portions 51 in a state where organic EL display panels have been manufactured in accordance with the manufacturing method according to the present embodiment.

First, a hole 6 for releasing gas between the mother sealing plate 4 and the mother substrate 3 during the below described step of fabricating a layered body is opened in the mother sealing plate 4 and the mother substrate 3. A case where a hole 6 as described above is opened in the mother sealing plate 4 is described in the present embodiment. FIG. 26(a) is a schematic top plan diagram showing the mother sealing plate 4 where the above described hole 6 has been opened. The hole 6 can be formed in accordance with an end mill method, a sand blast method, a wet etching method, a dry etching method, a laser beam radiation method or the like. This hole 6 is provided in order to release gas that exists in a space 22 that is surrounded by the mother substrate 3, the mother sealing plate 4 and the adhesive layer 5 to the outside during a layered body fabricating step of fabricating a layered body by pasting the mother substrate and the mother sealing plate together. A hole having a form and a size which can release gas that exists in the space 22 to the outside can be utilized as this hole 6.

In reference to FIG. 26(a), a hole 6 is provided to the layered body 1a in a region between dividing portions 51, 51 through which every four organic EL display portions 31 that are adjacent to each other, can be divided into organic EL display panels each of which has an organic EL display portion 31. The hole 6 can be provided to the mother sealing plate 4 in a region other than the organic EL display panel regions and in a region to which an adhesive is not applied in the below described adhesive applying step. In addition, it is preferable for the hole 6 to be provided in a region where the adhesive layer 5 does not exist between the mother substrate 3 and the mother sealing plate 4 in a state where the layered body 1a has been formed by making the mother substrate 3 on which the organic EL display portions have been formed adhere to the mother sealing plate 4 via the adhesive layer 5.

In addition, the organic EL display portion 31 that is formed of the organic EL elements 2 and the terminal portion 16 are formed on the surface of the mother substrate 3. Here, the organic EL elements 2 have a structure as that described above. At this time, each organic EL elements 2 is formed so that an anode 7 and a cathode 9 of the organic EL element 2 are electrically connected to the above described terminal portion 16. Furthermore, a protective film 11 is formed so as to cover the organic EL elements 2, 2 . . . (not shown).

Furthermore, a masking tape is pasted to the mother sealing plate 4 so as to cover the terminal portion 16, and thereby, masking is carried out, in order to prevent the adhesive layer 5 from reaching the terminal portion 16. This masking tape is made of a material to the rear surface of which the adhesive layer 5 does not adhere. A tape of which the rear surface is coated with a fluorine compound, for example, can be used. FIG. 26(b) is a schematic top plan diagram showing a case where organic EL display portions 31 are formed of organic EL elements 2 on the mother substrate 3, and a masking tape is pasted so as to cover the terminal portions 16.

Subsequently, an adhesive layer 5 is applied to the surface of the mother sealing plate 4, on the side to which the above described mother substrate 3 is pasted. FIG. 26(c) is a schematic top plan diagram showing a case where an adhesive layer 5 has been dropped onto each of the above described organic EL display portions 31, 31 . . . on the surface of the mother sealing plate 4. Though in the present embodiment, the adhesive layer 5 has been dropped in circular form in the vicinity of the center of each organic EL display portion 31, 31 . . . , as shown in FIG. 26(c), the form of the adhesive layer 5 is not limited to this, and may be in such a form that the mother substrate 3 and the mother sealing plate 4 can be pasted together via the adhesive layer 5, which covers each of the organic EL display portions 31.

Next, the above described mother substrate 3 and mother sealing plate 4 to which the above described adhesive layer 5 has been applied are pasted together, and the adhesive layer 5 is spread between the two substrates by pressing the mother substrate 3 and the mother sealing plate 4 against each other. FIG. 26(d) is a schematic top plan diagram showing a state where the adhesive layer 5 has been spread between the two substrates by pasting the mother substrate 3 and the mother sealing plate 4 together and pressing the mother substrate 3 and the mother sealing plate 4 against each other. As shown in FIG. 26(d), the adhesive layer 5 that has been dropped onto the four adjacent organic EL display portions 31 spreads into concentric circular shapes, and respective pieces of the adhesive layer 5 make contact with each other, so as to surround the hole 6, and thus, a space 22 is formed. In the case of the present embodiment, the space 22 is formed, regardless of whether or not the applied amount of the adhesive layer 5 is uneven, or even when the applied amount is great. This space 22 is an open space that is connected to the outside via the above described hole 6. In this state, regions 32 which are portions of the organic EL display portions 31 are not covered with the adhesive layer 5. Furthermore, the mother substrate 3 and the mother sealing plate 4 are pressed against each other, so that the adhesive layer 5 is further spread between the two substrates. In addition, gas that exists in the above described space 22 is released to the outside through the above described hole 6. FIG. 26(e) is a schematic top plan diagram showing a state where the adhesive layer 5 has further been spread between the two substrates by further pressing the mother substrate 3 and the mother sealing plate 4 against each other from the state shown in FIG. 26(d). In the present embodiment, the gas that exists in the space 22 can be released to the outside through the hole 6 that is connected to the above described space 22 by applying pressure, as described above. As a result of this, the space 22 can further be narrowed, and the gap between the mother substrate 3 and the mother sealing plate 4 can be narrowed. In addition, the adhesive layer 5 can be uniformly spread, so as to completely cover the entirety of the organic EL display portions 31.

As described above, the gas is released through the hole 6, and therefore, no closed spaces are created in the organic EL display portions 31, and the regions 32 on the organic EL display portions 31 which have existed and not been covered with the adhesive layer 5 in the state of FIG. 26(d) can also be covered with the adhesive layer 5, and thus, the adhesive layer 5 can completely cover the organic EL display portions 31. In addition, the adhesive layer 5 does not spread to the location of the above described hole 6, and therefore, the adhesion apparatus is not contaminated by adhesive leaking out from this hole 6.

Furthermore, the adhesive layer 5 is cured under predetermined conditions, and thereby, the layered body 1a is formed.

Next, the above described sealed body 1a is divided along dividing portions 51 between adjacent organic EL display portions 31. FIGS. 27(a) to 27(d) are schematic cross sectional diagrams illustrating the manner in which the sealed body 1a is divided along dividing portions 51. Here, FIGS. 27(a) to 27(d) are schematic cross sectional diagrams showing the case where cutting is carried out between EF of FIG. 26(e). Here, for the purpose of convenience, though FIGS. 27(a) to 27(d) illustrate the organic EL display portions 31 and the terminal portions 16 as not being connected to each other, the two are actually electrically connected to each other.

In reference to FIGS. 27(a) to 27(d), the organic EL display panels 1 are formed in such a manner that an organic EL display portions 31 and a protective layer 11 on the mother substrate 3 are sealed to the mother sealing plate 4 via the adhesive layer 5. In FIGS. 27(a) to 27(d), two pairs of an organic EL display portion 31 and a terminal portion 16 are formed between the mother substrate 3 and the mother sealing plate 4. The above described masking tape 17 is pasted to the above described terminal portions 16, and the rear surface of the masking tape and the adhesive layer 5 are not made to adhere to each other.

As shown in FIG. 27(a), dividing trenches 52 are formed in the surface of the mother substrate 3 and the mother sealing plate 4, which correspond to dividing portions 51. Next, appropriate stress is applied to the layered body 1a, and thereby, as shown in FIG. 27(b), the layered body 1a is divided into organic EL display panels 1 and unnecessary portions 61, and thereby, organic EL display panels 1 are taken out (two organic EL display panels, in the case of FIG. 27(b)).

Next, stress is applied to an organic EL display panel 1, and thereby, the portion of the mother sealing plate 4 which is located above the terminal portion 16 is removed. The masking tape 17 that exists on the terminal portion 16 and the adhesive layer 5 that exists on top of the masking tape are not made to adhere to each other, and therefore, the portion of the mother sealing plate 4 is easily separated from the interface between the rear surface of the masking tape 17 and the adhesive layer 5, when stress is applied to the organic EL display panel 1, and at the same time, an unnecessary portion 62, located above the terminal portion 16, of the organic EL display panel 1 made of the mother sealing plate 4 and the adhesive layer 5 can be separated from the mother substrate 3 (FIG. 27(c)). After that, the masking tape is peeled, so that the terminal portion 16 is exposed (FIG. 27(d)), and thus, the organic EL display panel 1 is completed.

As described above, according to the present invention, a desired gap between the mother substrate and the mother sealing plate can be maintained after the two have been finally sealed, without forming a closed space surrounded by the mother substrate, the mother sealing plate and the adhesive layer in the layered body fabricating step of fabricating a layered body by pasting the mother substrate and the mother sealing plate together, and the adhesive layer can be uniformly spread on the organic EL display portion, and thus, an organic EL display panel having high display quality, excellent light emitting properties and high reliability can be manufactured.

EXAMPLE 4

In the following, an example of an organic EL display panel 1 that has been fabricated in accordance with the manufacturing method according to the above described embodiment 3 is described.

As shown in FIG. 22(a), holes 6 were opened in a mother sealing plate 4 made of glass in accordance with an end mill method. The holes 6 were provided in the regions between dividing portions 51 and 51 for dividing a layered body 1a into organic EL display panels, each of which had an organic EL display portion 31, for every two organic EL display portions 31 which were adjacent to each other with a terminal portion 16 in between. The holes 6 were circular, and the diameter thereof was 1 mm.

In addition, as shown in FIG. 22(b), terminal portions 16 and organic EL display portions 31 were formed. First, terminal portions 16 were formed on a mother substrate 3 that was made of a TFT substrate. The terminal portions 16 were formed of a Cr film in accordance with a sputtering method.

In addition, anodes 7 were formed on the electrodes of the TFT substrate 6, and furthermore, cell separating films 10 were formed.

Subsequently, organic films 8 were deposited on the mother substrate 3 using a mask, and furthermore, cathodes 9 were formed using a mask, and thereby, organic EL display portions 31 made of organic EL elements 2, 2 . . . were formed. Furthermore, a layered film made of silicon nitride/silicon oxide/silicon nitride was formed on the mother substrate 3 as a protective film 11. This protective film 11 was formed through patterning using a mask so as to cover the above described organic EL display portions 31.

Next, a partition 14 was formed by applying an ultraviolet ray curing resin having a high viscosity to the surface of the mother sealing plate 4, on the side which was pasted to the above described mother substrate 3. In the present example, as shown in FIG. 22(c), an ultraviolet ray curing resin having a high viscosity, where a gap agent made of balls (beads) having a diameter of 10 µm of which the material was a resin is dispersed was applied onto the surface of the mother sealing plate 4 in the locations that correspond to locations between the above described organic EL display portions 31 and the terminal portions 16 which are electrically connected to the organic EL elements 2 that form the organic EL display portions 31, and in the vicinity of the dividing portions 51 on the side opposite to the terminal portions 16 with the locations in between, so as to have linear forms which are longer than the terminal portions 16, as the partition 14. The partition 14 can prevent the adhesive layer 5 from reaching the terminal portions 15.

Subsequently, as shown in FIG. 22(d), an adhesive layer 5 made of an ultraviolet ray curing resin is applied in the form of bands which penetrate through the adjacent organic EL display portions 31 and 31, and in the form of lines crossing the above described band forms on the respective organic EL display portions 31, in regions that include the above described organic EL display portions 31 and exclude the terminal portions 16 and the above described holes 6 on the surface of the mother sealing plate 4, on the side which is pasted to the above described mother substrate 3.

Next, the above described mother substrate 3 and mother sealing plate 4 to which the above described adhesive 5 was applied and where the partition 14 was formed were pasted together under atmospheric pressure, and the mother substrate 3 and the mother sealing plate 4 were pressed against each other through the application of external force, and thereby, the adhesive layer 5 was spread between the two substrates (FIG. 22(e)). Here, even when the adhesive layer 5 spread, the partition 14 prevented the adhesive layer 5 from reaching the terminal portions 16. In the present example, the partition 14 was made of an ultraviolet ray curing resin, which is an ultraviolet ray curing resin having a high viscosity and barely spreads, and therefore, it did not reach the terminal portions 16, and in addition, prevented the adhesive layer 5 from reaching the terminal portions 16.

In the step of spreading this adhesive layer 5, as shown in FIG. 22(e), the adhesive layer 5 spread. In reference to FIG. 22(e), the organic EL display portion (Y) and the organic EL display portion (Z) were completely covered with the adhesive layer 5, while the organic EL display portion (W) and the organic EL display portion (X) were not completely covered with the adhesive layer 5. In FIG. 22(e), the regions 24 are regions of the display portions which were not covered with the adhesive layer 5. The portions of the adhesive layer 5 which spread around the two ends of the partition 14 toward the organic EL display portion (W) side and the organic EL display portion (X) side made contact with the partitions 14 and 14 between the terminal portions 16, which were electrically connected to the organic EL display portion (W) and the organic EL display portion (X), respectively, so as to form spaces 25 and 25.

In this case, when the mother substrate 3 and the mother sealing plate 4 were further pressed against each other, so that the adhesive layer 5 further spread between the two substrates, as shown in FIG. 22(f), the organic EL display portion (W) and the organic EL display portion (X) were completely covered with the adhesive layer 5. The spaces 25 were also connected to the outside of the layered body 1a via the above described holes 6, and therefore, the spaces 25 were open spaces through which the adhesive layer 5 spread, and gas that existed in the spaces 25 was released to the outside through the above described holes 6. As described above, the gas was released through the holes 6, and therefore, the gap between the mother substrate 3 and the mother sealing plate 4 could be narrowed to the diameter of the gap material that had been added to the partition 14, and in addition, the organic EL display portions 31 could be completely covered with the adhesive layer 5 without creating any closed spaces in the organic EL display portions 31. In addition, the adhesive layer 5 did not spread to the locations of the above described holes 6, and therefore, no adhesive leaked out through the holes 6.

Furthermore, the adhesive layer 5 and the partition 14 made of ultraviolet ray curing resins were cured under predetermined conditions, and thereby, the layered body 1a was formed.

Subsequently, as shown in FIG. 23(a), dividing trenches 52 were provided to the dividing portions 51 in the mother sealing plate 4 and the mother substrate 3 using a diamond cutter. Furthermore, pressure was applied to the mother sealing plate 4 and the mother substrate 3, and thereby, as shown in FIG. 23(b), the two were divided into the organic EL display panels 1 and unnecessary portions 61. Here, division was carried out in such a manner that the holes 6 did not exist in the organic EL display panels 1, and the holes 6 existed in the unnecessary portions 61. Furthermore, as shown in FIG. 23(c), the unnecessary portions 62 were removed from the mother sealing plate 4 by applying stress to the organic EL display panels 1, and thereby, the terminal portions 16 were exposed, and thus, the organic EL display panels 1 were completed.

When the fabricated organic EL display panels 1 were observed through an optical microscope, no closed spaces were found throughout the entirety of the organic EL display panels 1.

As described above, according to the present invention, a predetermined amount or more of an adhesive layer is applied so that there is no shortage of the applied amount, and thereby, even in the case where there is unevenness in the amount of the applied adhesive layer, no closed spaces surrounded by the mother substrate, the mother sealing plate and the adhesive layer are formed in the layered body fabricating step of fabricating a layered body by pasting the mother substrate and the mother sealing plate together, so that the final gap between the mother substrate and the mother sealing plate after sealing can be maintained at a desired distance, and the adhesive layer can be uniformly spread in the organic EL display portion, and thereby, an organic EL display panel having high display quality, excellent light emitting properties and high reliability can be manufactured.

EXAMPLE 5

Next, in the following, an example of an organic EL display panel 1 that has been manufactured in accordance with the manufacturing method according to the above described embodiment 4 is described.

As shown in FIG. 24(a), holes 6 were opened in a mother sealing plate 4 made of glass, in accordance with a sandblast method. In reference to FIG. 24(a), the holes 6 were provided in the regions between dividing portions 51 and 51 for dividing the layered body 1a into organic EL display panels, each of which had an organic EL display panel 31, for every four adjacent organic EL display portions 31. The holes 6 were circular and the diameter thereof was 1 mm.

In addition, in the same manner as in Example 4, terminal portions 16 and organic EL display portions 31 were formed on a mother substrate 3, and furthermore, a protective film 11 was formed on the above described organic EL display portions 31 (FIG. 24(b)).

Subsequently, an adhesive layer 5 made of an ultraviolet ray curing resin was applied to the surface of a mother sealing plate 4, on the surface to which the above described mother substrate 3 was pasted, by dropping the adhesive in circular form in the vicinity of the center of each of the organic EL display portions 31, 31 . . . , as shown in FIG. 24(c).

Next, the above described mother substrate 3 and the mother sealing plate 4, to which the above described adhesive layer 5 was applied, were pasted together under atmospheric pressure, and the mother substrate 3 and the mother sealing plate 4 were pressed against each other through the application of external force, and thereby, the adhesive layer 5 was spread between the two substrates (FIG. 24(d)).

In the step of spreading the adhesive layer 5 in this manner, as shown in FIG. 24(d), the adhesive layer 5 that was dropped onto the four adjacent organic EL display portions 31 spread, so that the pieces of the adhesive layer 5 made contact with each other so as to surround the hole 6, forming a space 22. This space 22 was an open space that was connected to the outside of the layered body 1a via the above described hole 6. In addition, regions 32 which were not covered with the adhesive layer 5 existed in portions of the organic EL display portions 31.

Furthermore, the mother substrate 3 and the mother sealing plate 4 were pressed against each other, and the adhesive layer 5 was further spread between the two substrates (FIG. 24(e)). The above described space 22 was connected to the outside of the layered body 1a via the above described hole 6, and therefore, the space 22 was an open space allowing the adhesive layer 5 to spread and gas which existed in the space 22 was released to the outside through the above described hole 6. As described above, the gas could be released through the hole 6, and therefore, no closed spaces were created in the organic EL display portions 31, and the regions 32 in the organic EL display portions 31 which existed in the state of FIG. 24(d) and were not covered with the adhesive layer 5 were also covered with the adhesive layer 5, so that the adhesive layer 5 completely covered the organic EL display portions 31. In addition, the adhesive layer 5 did not spread to the location of the above described hole 6, and therefore, no adhesive leaked out through the hole 6.

Furthermore, the layered body 1a was formed by curing the adhesive layer 5 made of an ultraviolet ray curing resin under predetermined conditions. At this time, the portions of the adhesive layer 5 that existed above the terminal portions 16 were blocked with a mask, while other regions were irradiated with ultraviolet rays, and thereby, the ultraviolet ray curing resin in regions other than the portions above the terminal portions 16 was cured, while the portions of the adhesive layer 5 that existed above the above described terminal portions 16 were not cured.

Subsequently, as shown in FIG. 25(a), dividing trenches 52 were provided to the dividing portions 51 in the mother sealing plate 4 and the mother substrate 3 using a diamond cutter. Furthermore, pressure was applied to the mother sealing plate 4 and the mother substrate 3, and thereby, as shown in FIG. 25(b), the two were divided into the organic EL display panels 1 and unnecessary portions 61. Here, the holes 6 were provided in the regions between the dividing portions 51 and 51 for dividing the layered body 1a into the organic EL display panels, each of which had an organic EL display portion 31, for every four adjacent organic EL display portion 31, and therefore, no holes 6 existed in the organic EL display panels 1. Furthermore, as shown in FIG. 25(c), stress was applied to the organic EL display panels 1, so as to remove the unnecessary portions 62 from the mother sealing plate 4, and in addition, the uncured adhesive layer 15 that was attached to the end portions 16 was washed and removed, and thereby, the terminal portions 16 were exposed, and thus, the organic EL display panels 1 were completed.

When the fabricated organic El display panels 1 were observed through an optical microscope, no closed spaces were found throughout the entirety of the organic EL display panels 1.

As described above, according to the present invention, no closed spaces surrounded by the mother substrate, the mother sealing plate and the adhesive layer are formed in the layered body fabricating step of fabricating a layered body by pasting the mother substrate and the mother sealing plate together, so that the final gap between the mother substrate and the mother sealing plate after sealing can be maintained at a desired distance, and the adhesive layer can be uniformly spread in the organic EL display portion, and thereby, an organic EL display panel having high display quality, excellent light emitting properties and high reliability can be manufactured.

EXAMPLE 6

Next, an example of an organic EL display panel 1 that has been manufactured in accordance with the manufacturing method according to the above described embodiment 4 is described.

In the same manner as in Example 5, holes 6 were opened in a mother sealing plate 4 (FIG. 26(a)), terminal portions 16 and organic EWL display portions 31 were formed on mother substrate 3 (FIG. 26(b)), and in addition, a protective film 11 was formed on the above described organic EL display portions 31.

Next, as shown in FIG. 26(b), a masking tape 17 made of a tape on the rear surface of which fluorine coating was carried out was stuck to the mother sealing plate 4 so as to cover the terminal portions 16, and thereby, masking for preventing the adhesive layer 5 from reaching the terminal portions 16 was carried out.

Subsequently, in the same manner as in Example 5, an adhesive layer 5 made of an ultraviolet ray curing resin was applied to the surface of the mother sealing plate 4 (FIG. 26(c)).

Figure 26:
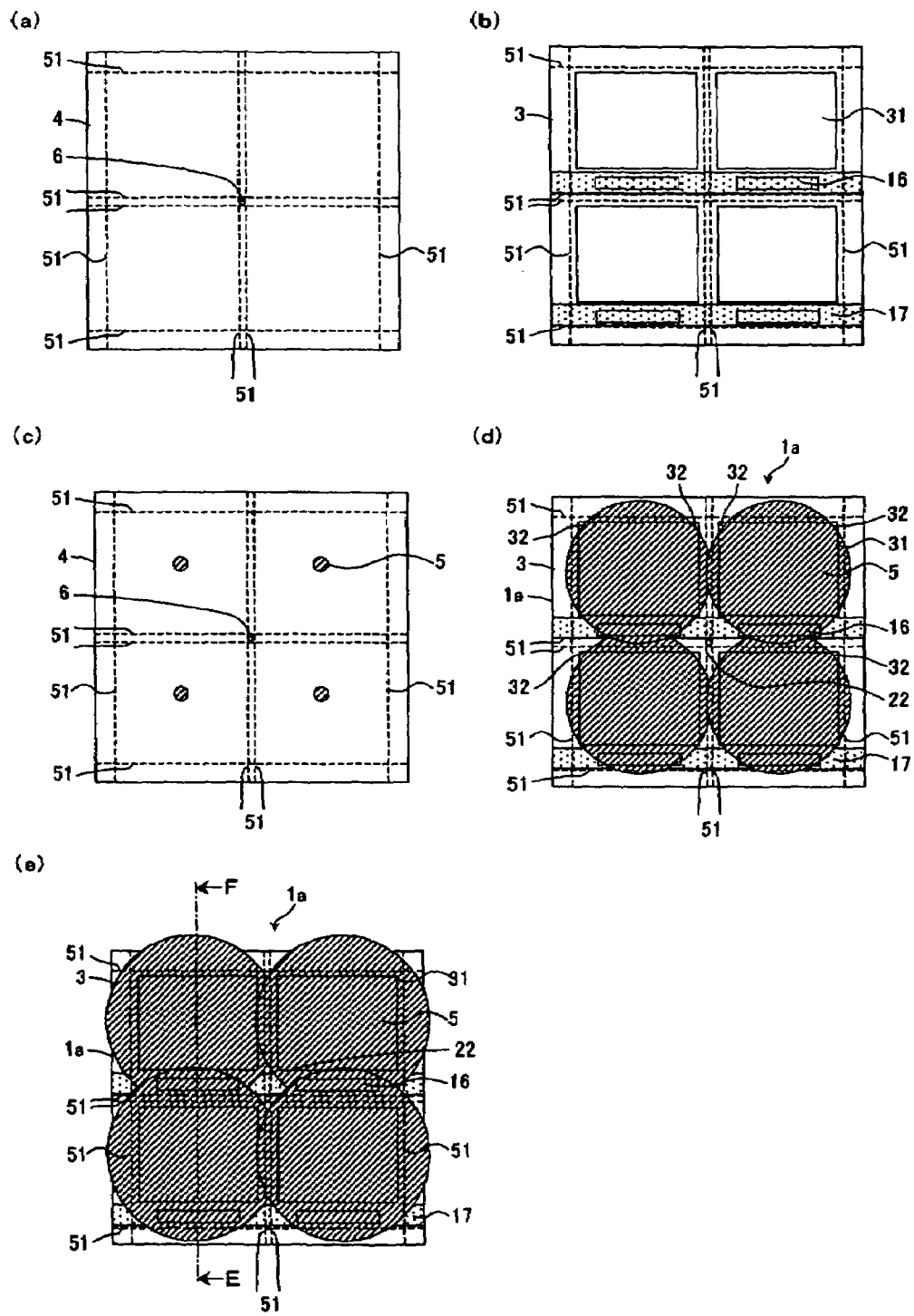
FIGS. 26(a) to 26(e) are schematic top plan diagrams illustrating a manufacturing method for an organic EL display panel according to Embodiment 5.

Furthermore, in the same manner as in Example 5, the above described mother substrate 3 and the mother sealing plate 4, to which the above described adhesive layer 5 was applied, were pasted together under atmospheric pressure, and the mother substrate 3 and the mother sealing plate 4 were pressed against each other through the application of external force, and thereby, the adhesive layer 5 was spread between the two substrates (FIGS. 26(*d*) and 26(*e*)).

The step of spreading the adhesive layer 5 and releasing gas that exists in the space 22 through the hole 6 was carried out in the same manner as in Example 5.

Furthermore, the adhesive layer 5 made of an ultraviolet ray curing resin was cured under predetermined conditions, and thereby, the layered body 1*a* was formed.

Figure 27:
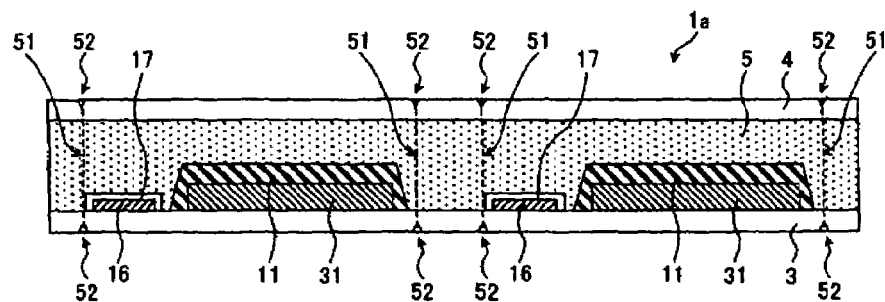
FIGS. 27(a) to 27(d) are schematic cross sectional diagrams illustrating a manufacturing method for an organic EL display panel according to Embodiment 5.
Figure 27:
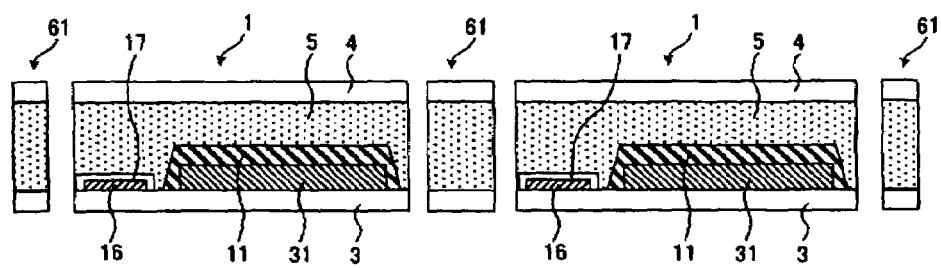
Figure 27:
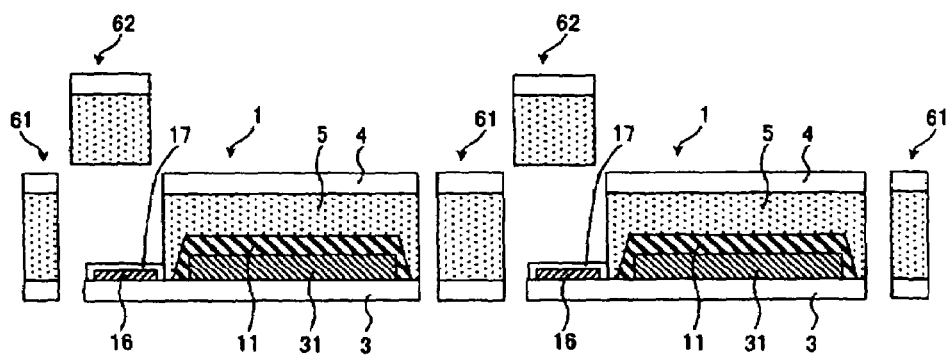
Figure 27:
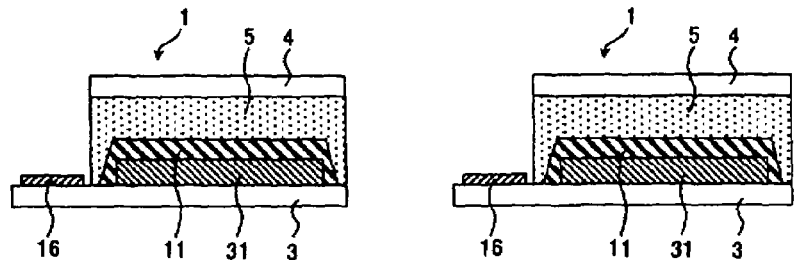

Subsequently, as shown in FIG. 27(*a*), dividing trenches 52 were provided to the dividing portions 51 in the mother sealing plate 4 and the mother substrate 3 using a diamond cutter. Furthermore, pressure was applied to the mother sealing plate 4 and the mother substrate 3, and thereby, as shown in FIG. 27(*b*), the two were divided into the organic EL display panels 1 and unnecessary portions 61. Here, the holes 6 were provided in the regions between the dividing portions 51 and 51 for dividing the layered body 1*a* into the organic EL display panels, each of which had an organic EL display portion 31, for every four adjacent organic EL display portion 31, and therefore, no holes 6 existed in the organic EL display panels 1. Furthermore, as shown in FIG. 27(*c*), stress was applied to the organic EL display panels 1, so as to remove the unnecessary portions 62 from the mother sealing plate 4, and in addition, the masking tape 17 was peeled off, and thereby, the terminal portions 16 were exposed, and thus, the organic EL display panels 1 were completed.

When the fabricated organic El display panels 1 were observed through an optical microscope, no closed spaces were found throughout the entirety of the organic EL display panels 1.

As described above, according to the present invention, no closed spaces surrounded by the mother substrate, the mother sealing plate and the adhesive layer are formed in the layered body fabricating step of fabricating a layered body by pasting the mother substrate and the mother sealing plate together, so that the final gap between the mother substrate and the mother sealing plate after sealing can be maintained at a desired distance, and the adhesive layer can be uniformly spread in the organic EL display portion, and thereby, an organic EL display panel having high display quality, excellent light emitting properties and high reliability can be manufactured.

COMPARISON EXAMPLE 1

In the following, a comparison example for the above described Example 4 is described.

The present comparison example is the same as Example 4, except for that no holes 6 were formed in the mother sealing plate 4.

In the present comparison example, in FIG. 22(*e*), regions 24 are regions of organic EL display portions which are not covered with the adhesive layer 5 during the step of spreading the adhesive layer 5 in the same manner as in Example 4. In the case of this example, no holes 6 were formed in the mother sealing plate 4, and therefore, the space 25 in FIG. 22(*e*) became a closed space.

In this case, the height of this closed space was greater than the diameter of the gap material which was contained in the partitions 14 for determining the size of the desired gap between the mother substrate 3 and the mother sealing plate 4, and this height became the gap between the mother substrate 3 and the mother sealing plate 4, and therefore, the gap between the mother substrate 3 and the mother sealing plate 4 could not be narrowed further, even when pressed further. Accordingly, the adhesive layer 5 could not be spread further from the state where the adhesive layer 5 spread, as shown in FIG. 22(*e*), and the regions 24 which were not covered with the adhesive layer 5 on the organic EL display portions 31 remained.

It is assumed that this is because in the present comparison example, the applied amount of the adhesive layer 5 that was applied to the regions that correspond to the organic EL display portion (Y) and the organic EL display portion (Z) was greater than the applied amount of the adhesive layer 5 that was applied to the regions that correspond to the organic EL display portion (W) and the organic EL display portion (X). It is assumed that the extra adhesive layer 5 which spread from the regions that correspond to the organic EL display portions having a large applied amount made contact with the partitions between the organic EL display portions and the terminal portions which were adjacent to and electrically connected to the organic EL display portions, and thereby, a closed space which corresponds to the space 25 shown in FIG. 22(*e*) was formed. That is to say, the applied amount of the adhesive layer 5 was uneven, and it is assumed that the adhesive layer 5 which spread from the portions where the applied amount was large made contact with the partitions, and thereby, the closed space was formed.

As described above, in the case where a predetermined applied amount or more of the adhesive layer which does not become an insufficient applied amount becomes uneven, it can be seen that the portions of the adhesive layer that spread from portions of which the applied amount is large make contact with each other, or the portions of the adhesive layer that spread from portions of which the applied amount is large make contact with the partitions, and thereby, a closed space that is surrounded by the mother substrate, the mother sealing plate and the adhesive layer, or by the mother substrate, the mother sealing plate, the adhesive layer and the partitions is formed during the layered body fabricating step of fabricating a layered body, by pasting the mother substrate and the mother sealing plate together, in the case where the above described holes are not provided.

Though in the case of the present comparison example, four display panels were gained from a pair of a mother substrate 3 and a mother sealing plate 4, in the case where a greater number of display panels are gained from a pair of a mother substrate 3 and a mother sealing plate 4, even one organic EL display portion 31 having a large applied amount causes a closed space, preventing all of the organic EL display panels in final form which correspond to organic EL display portions 31 where the applied amount is not large compared to the large applied amount from having a desired gap between the mother substrate and the mother sealing plate, and thus, there is a risk that a large amount of defective panels where the adhesive layer is not uniformly spread in the organic EL display portion may be manufactured.

As described above, in the present comparison example, an organic EL display panel having high display quality could not be fabricated.

COMPARISON EXAMPLE 2

In the following, a comparison example for the above described Example 5 is described.

The present comparison example is the same as Example 5, except for that no holes 6 were formed in the mother sealing plate 4.

Figure 24:
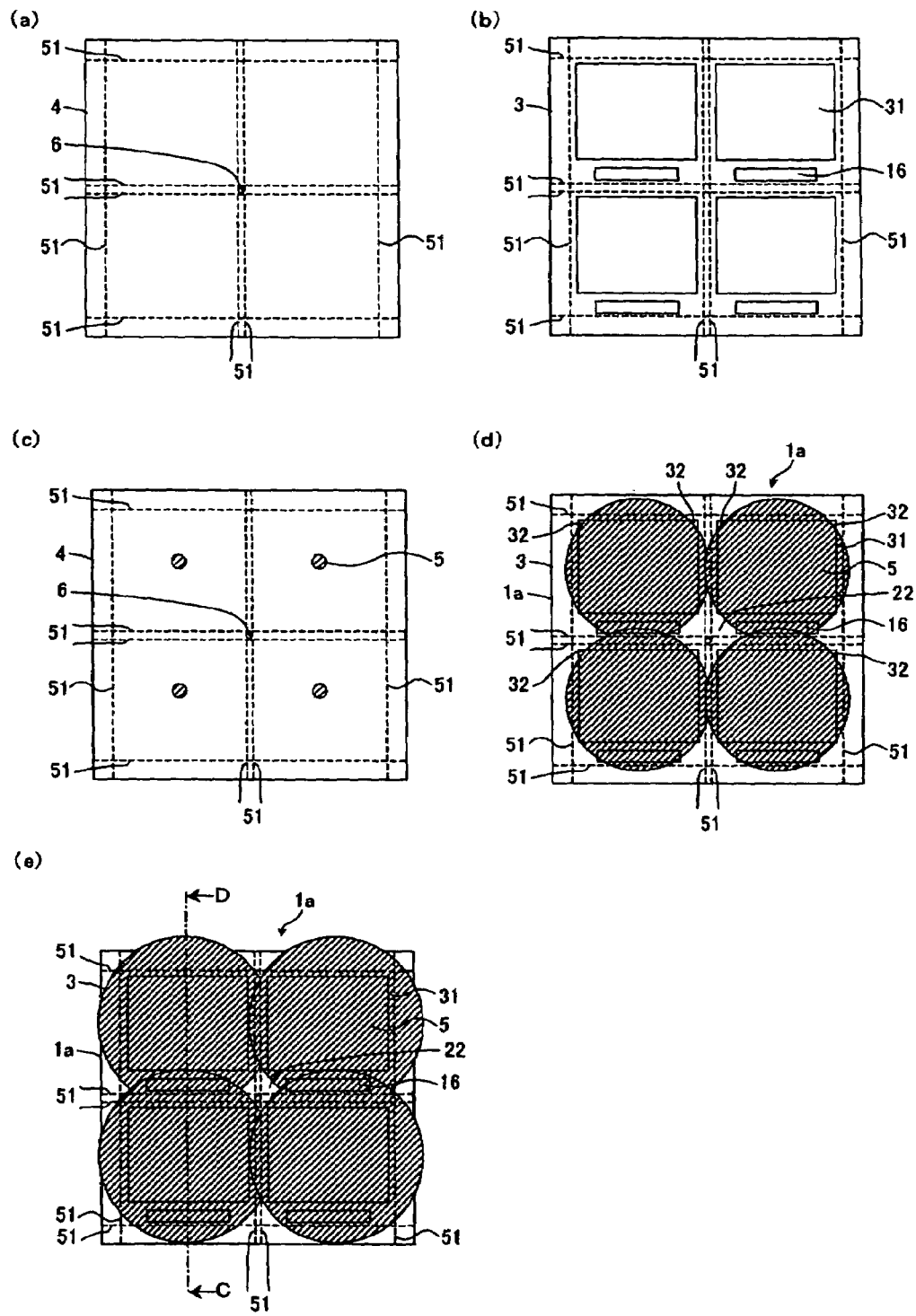
FIGS. 24(a) to 24(e) are schematic top plan diagrams illustrating a manufacturing method for an organic EL display panel according to Embodiment 4.
Figure 25:
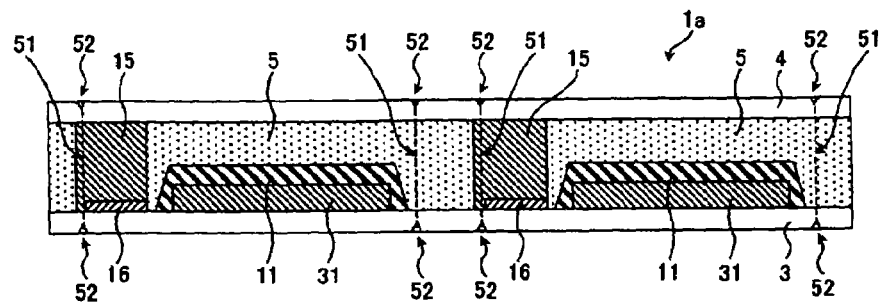
FIGS. 25(a) to 25(d) are schematic cross sectional diagrams illustrating a manufacturing method for an organic EL display panel according to Embodiment 4.
Figure 25:
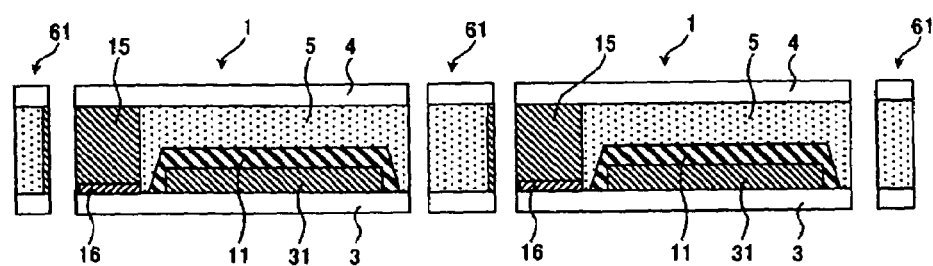
Figure 25:
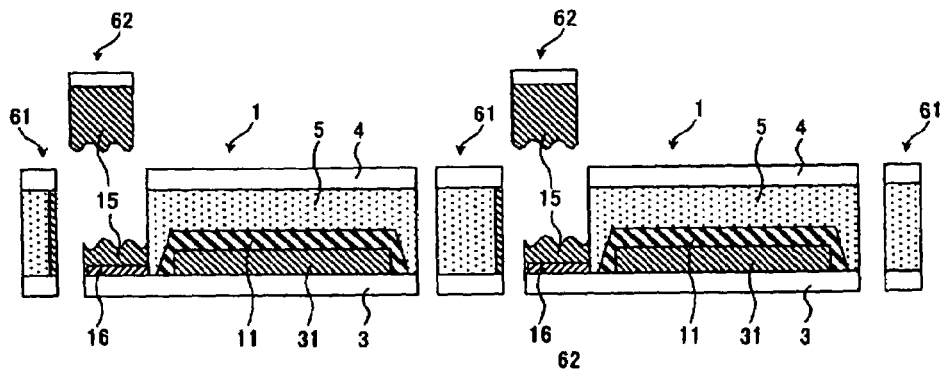
Figure 25:
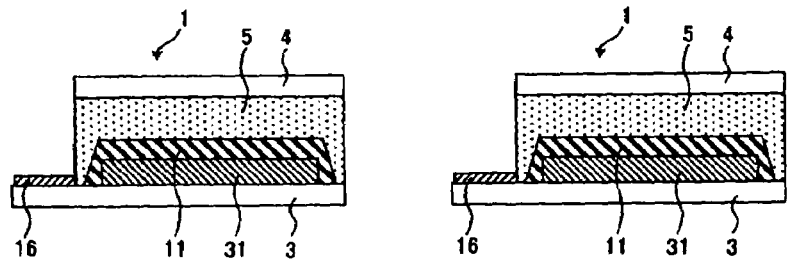

In the present comparison example, a closed space surrounded by the mother substrate 3, the mother sealing plate 4 and the adhesive layer 5 was provided instead of the open space 22 in FIG. 24(*d*) as a result of the step of spreading the adhesive layer 5 in the same manner as in Example 5 because there were no holes 6. In this case, the height of the closed space became the gap between the mother substrate 3 and the mother sealing plate 4, and therefore, the gap between the mother substrate 3 and the mother sealing plate 4 could not be narrowed further, even when pressed further. Accordingly, the adhesive layer 5 could not be spread further from the spread state of adhesive layer 5, as shown in FIG. 24(*d*), and the regions which were not covered with the adhesive layer 5, for example, regions 32 in FIG. 24(*d*), remained on the organic EL display portions 31, in addition to the formation of this closed space.

As described above, in the present comparison example, an organic EL display panel having high display quality could not be fabricated.

COMPARISON EXAMPLE 3

In the following, a comparison example for the above described Example 6 is described.

The present comparison example is the same as Example 6, except for that no holes 6 were formed in the mother sealing plate 4.

In the present comparison example, a closed space surrounded by the mother substrate 3, the mother sealing plate 4 and the adhesive layer 5 was provided instead of the open space 22 in FIG. 26(*d*) as a result of the step of spreading the adhesive layer 5 in the same manner as in Example 6 because there were no holes 6. In this case, the height of the closed space became the gap between the mother substrate 3 and the mother sealing plate 4, and therefore, the gap between the mother substrate 3 and the mother sealing plate 4 could not be narrowed further, even when pressed further. Accordingly, the adhesive layer 5 could not be spread further from the spread state of adhesive layer 5, as shown in FIG. 26(*d*), and the regions which were not covered with the adhesive layer 5, for example, regions 32 in FIG. 26(*d*), remained on the organic EL display portions 31, in addition to the formation of this closed space.

As described above, in the present comparison example, an organic EL display panel having high display quality could not be fabricated.

As described above, according to the present invention, no closed spaces surrounded by the mother substrate, the mother sealing plate and the adhesive layer are formed in the layered body fabricating step of fabricating a layered body by pasting the mother substrate and the mother sealing plate together, so that the final gap between the mother substrate and the mother sealing plate after sealing can be maintained at a desired distance, and the adhesive layer can be uniformly spread on the organic EL display portion, and thereby, an organic EL display panel having high display quality, excellent light emitting properties and high reliability can be manufactured with high yield.

As described above, the present invention is described with the embodiments. Those skilled in the art will understand that these embodiments are illustrative, and combinations of these components and processes make a variety of modifications possible, and such modifications are within the scope of the present invention.

In addition, though the configuration of top emission, where light emitted from organic EL elements 2, 2... is taken out from the mother sealing plate 4 side, is described in the embodiments, the technology according to the present invention can be applied to the configuration of bottom emission, where light emitted from organic EL elements 2, 2... is taken out from the mother substrate 3 side. In the case where the technology of the present invention is applied to the configuration of bottom emission, the same effects as those in the case of the above described embodiments can be gained.

What is claimed is:

1. A method for manufacturing a light emitting panel comprising the steps of:
    preparing a mother substrate and a mother sealing plate;
    forming a plurality of light emitting portions on said mother substrate;
    fabricating a layered body by making said mother sealing plate adhere to said mother substrate via an adhesive layer so as to cover said plurality of light emitting portions; and
    separating said layered body into pieces, each of which has a light emitting portion, and thus forming a plurality of light emitting panels,
    wherein a hole is formed through said mother substrate or mother sealing plate in a desired region which is located between adjacent light emitting portions, and air between the two substrates is released to the outside through said hole by said adhesive layer which is spread by pressing said mother substrate and said mother sealing plate against each other so as to make said mother substrate and mother sealing plate adhere to each other.

2. The manufacturing method for a light emitting panel according to claim 1, wherein the location of the hole that is provided in said mother substrate or said mother sealing plate is provided in a region other than said light emitting panels, and in a region in which said adhesive layer is not applied.

3. The manufacturing method for a light emitting panel according to claim 1, wherein said hole is provided in advance in a region of said mother substrate or said mother sealing plate where no adhesive layer exists between said mother substrate and said mother sealing plate in a state where said layered body has been formed.

4. The manufacturing method for a light emitting panel according to claim 1, wherein said step of fabricating a layered body is carried out under atmospheric pressure.

\* \* \* \* \*